United States Patent [19]
Yokogawa et al.

[11] Patent Number: 6,033,481
[45] Date of Patent: Mar. 7, 2000

[54] PLASMA PROCESSING APPARATUS

[75] Inventors: Ken'etsu Yokogawa, Hachioji; Tetsuo Ono, Kokubunji; Kazunori Tsujimoto, Yamato; Naoshi Itabashi, Hachioji; Masahito Mori, Kokubunji; Shinichi Tachi, Sayama; Keizo Suzuki, Kodaira, all of Japan

[73] Assignee: Hitachi, Ltd., Tokyo, Japan

[21] Appl. No.: 09/225,971

[22] Filed: Jan. 6, 1999

Related U.S. Application Data

[62] Division of application No. 08/766,818, Dec. 13, 1996, Pat. No. 5,891,252.

[30] Foreign Application Priority Data

Dec. 15, 1995 [JP] Japan .................................. 7-326824
Mar. 29, 1996 [JP] Japan .................................. 8-075854

[51] Int. Cl.$^7$ ............................................... C23C 16/00
[52] U.S. Cl. .................. 118/723; 118/723 E; 118/123 I; 156/345
[58] Field of Search .......................... 118/723 AN, 723 I, 118/723 IR, 723 E, 723 MA, 723 MR; 315/111.51; 156/345; 204/298.16, 298.37

[56] References Cited

U.S. PATENT DOCUMENTS

| | | |
|---|---|---|
| 5,110,438 | 5/1992 | Ohmi et al. . |
| 5,401,351 | 3/1995 | Samukawa . |
| 5,683,537 | 11/1997 | Ishii . |
| 5,716,451 | 2/1998 | Hama et al. . |

FOREIGN PATENT DOCUMENTS

| | | |
|---|---|---|
| 3-122294 | 5/1991 | Japan . |
| 6-224155 | 8/1994 | Japan . |
| 7-307200 | 11/1995 | Japan . |

OTHER PUBLICATIONS

Applied Physics Letters, vol. 62, No. 13, Mar. 29, 1993, "Uniform plasma produced by a plane slotted antenna with magnets for electron cyclotron resonance", Iizuka et al, pp. 1469–1471.

Hitachi Hyoron, vol. 76, No. 7, 1994, "High Density Microwave Plasma Etching Equipment for 200 mm Diameter Wafers", Tamura et al, pp. 55–58.

*Primary Examiner*—Bruce Breneman
*Assistant Examiner*—Rudy Zervigon
*Attorney, Agent, or Firm*—Beall Law Offices

[57] ABSTRACT

A plasma processing apparatus in which power consumption is reduced, which can generate uniform plasma in a large range and in which minute processing in high etching selectivity and in high aspect ratio is enabled is disclosed. High density plasma is generated in a vacuum vessel housing a processed sample utilizing an electron cyclotron resonance phenomenon caused by an electromagnetic wave in an ultra-high frequency band and a magnetic field and the surface of the processed sample is etched using this plasma. An electromagnetic wave in an ultra-high frequency band for generating plasma is radiated from a planar conductive plate consisting of graphite or silicon which is arranged opposite to the surface of the processed sample into space inside the vacuum vessel. High density plasma in the low degree of dissociation can be generated by using an electromagnetic wave in an ultra-high frequency band and as a result, the controllability of etching reaction can be enhanced. Further, a radical effective in etching can be increased by reaction between the surface of a planar conductive plate for radiating an electromagnetic wave and plasma.

23 Claims, 16 Drawing Sheets self-aligned contact hole contact-hole

PLASMA PROCESSING APPARATUS

This is a divisional application of U.S. Ser. No. 08/766,818, filed Dec. 13, 1996, now U.S. Pat. No. 65,891,252.

BACKGROUND OF THE INVENTION

The present invention relates to equipment for manufacturing a semiconductor device, particularly relates to a plasma surface processing apparatus used in a dry etching process for charging source gas in a chamber and processing the surface of semiconductor material by the physical or chemical reaction of its activated particle.

For a plasma utilizing apparatus used in the conventional manufacturing process of a semiconductor device, there is a magnetic field-provided microwave plasma etching apparatus described on pages 55 to 58 in No. 7 of "Hitachi Hyoron Vol. 76 published in 1994", for example for etching. The magnetic field-provided microwave plasma etching apparatus charges gas with an electromagnetic wave in a microwave band brought into a vacuum vessel via a magnetic field generated in a solenoid coil and a microwave circuit. As high density plasma can be obtained under low gas pressure in this conventional apparatus, a sample can be processed precisely and at a high speed. Further, a magnetic field-provided microwave plasma etching apparatus using a local magnetic field by a permanent magnet is reported for example on pages 1469 to 1471 in No. 13 of "Appl. Phys. Lett. Vol. 62 published in 1993". As a magnetic field is formed by a permanent magnet in this apparatus, both the cost of the apparatus and power consumption can be particularly reduced than those of the above conventional apparatus. In Japanese published unexamined patent application No. H3-122294, the methods of generating plasma by a high frequency in a band from 100 MHz to 1 GHz and efficient etching using a mirror field are disclosed. Further, in Japanese published unexamined patent application No. H6-224155, a method of generating uniform plasma in a chamber with a large bore diameter by a high frequency in a band of 100 to 500 MHz from an antenna in a comb shape is described.

A narrow electrode plane-parallel plate-type (hereinafter called a narrow electrode-type) apparatus is realized particularly for processing silicon oxide. Referring to the narrow electrode type, a high frequency in a band from a few teens to scores MHz is applied between plane-parallel plates apart by 1 to 2 cm to generate plasma. The narrow electrode-type apparatus is used when the pressure of source gas is scores mTorr. This narrow electrode-type apparatus is characterized in that relatively stable oxide film etching characteristics can be obtained for a long term.

In Japanese published unexamined patent application No. H7-307200, application of a high frequency in a band of approximately 300 MHz from a radial antenna with the length of one fourth of an input wave length is described.

However, as a plurality of small-sized permanent magnets are used in the above magnetic field-provided microwave etching apparatus using a local magnetic field by a permanent magnet, the uniformity of plasma in an area in which plasma is mainly generated in the range of a magnetic field is poor and therefore, plasma is uniformed by diffusion by setting a processed sample in a position far from a plasma generated area. Therefore, there is a problem that the sufficient density of plasma cannot be obtained in a position in which a processed sample is set and a sufficient processing rate cannot be obtained.

As an electromagnetic wave is applied to a magnetic field-provided microwave plasma source from a position opposite to a sample in an electron cyclotron resonance (ECR)-type apparatus described in Japanese published unexamined patent applications No. H3-122294 and No. H6-224155, only an insulator can be formed in the position opposite to a sample. Therefore, an earth electrode required in case high frequency bias is applied to a processed sample cannot be formed in an ideal position opposite to the processed sample and there is also a problem that bias is uneven.

Further, the narrow electrode type has a problem that the directivity of the ions incident into the processed sample is uneven particularly when the width of the narrow electrode type is 0.2 $\mu$m or less because the pressure of gas used for the type is relatively high, minute processability is bad and an etching rate is slow because the density of plasma is low. In the meantime, an apparatus using a so-called high density plasma source such as the ECR type and an inductive coupling type has a problem that the dissociation of source gas excessively progresses, chemical reaction in a chamber or on the surface of a wafer is difficult to control and stable etching characteristics are difficult to obtain. Particularly, as in silicon oxide etching process, the selectivity of etching is obtained by making etching and deposition compete, the badness of the controllability of reaction has an important effect upon the selectivity and the performance of the processing of a deep hole (the processing in high aspect ratio).

If an antenna in a comb shape disclosed in Japanese published unexamined patent application No. H6-224155 and a radial antenna disclosed in Japanese published unexamined patent application No. H7-307200 are used, plasma is evener than in case they are not utilized, however, sufficient uniformity cannot be obtained.

SUMMARY OF THE INVENTION

Therefore, an object of the present invention is to provide a plasma processing apparatus which does not require large power consumption, also generates very uniform magnetic field-provided microwave plasma if the area to be processed of a processed sample is large, is excellent in minute processability and enables processing in high selectivity and high aspect ratio and processing at a high speed.

Another object of the present invention is to provide a plasma processing apparatus the earth electrode of which can be also installed in a position opposite to a processed sample wherein hereby, high frequency bias can be also readily uniformed in an ECR-type apparatus.

The above first object is achieved by supplying an electromagnetic wave from a power source to a conductive plate in a planar shape and radiating the electromagnetic wave for forming plasma from the conductive plate. As an electromagnetic wave can be supplied on the surface of a wafer uniformly in parallel by supplying the electromagnetic wave from the plane, the high uniformity of plasma can be obtained.

Further, as the wavelength of an electromagnetic wave between 300 MHz and 1 GHz is 30 to 80 cm and is substantially equal to the diameter of the vacuum vessel of a plasma processing apparatus for the large diameter wafer of approximately 8 to 16 inches if the electromagnetic wave the frequency of which is in an ultra-high frequency band between 300 MHz and 1 GHz is supplied, the electromagnetic wave is suitable for processing a wafer with a large diameter.

If the pressure of etching gas is in the range of 0.11 to 3 Pa, the directivity of the ions contributing to etching is uniform, an etching rate is increased and there is an effect that minute processability is particularly excellent. If gas pressure is reduced beyond the above range, the density of plasma is reduced, a desired etching rate cannot be obtained and in the meantime, if gas pressure is increased beyond the above range, the directivity of the ions is not uniform.

Further, a desired radical can be efficiently obtained by selecting the material of the conductive plate and etching gas so that a radical required for etching is formed by reacting the conductive plate with etching gas and as a result, reaction can be readily controlled. Particularly, when voltage with a frequency in an ultra-high frequency band and high frequency voltage with a frequency different from that in the ultra-high frequency band are supplied together to this conductive plate, bias applied to the conductive plate is increased, reactivity between the conductive plate and reaction gas is increased and more desired radicals contributing to etching reaction can be generated.

The above second object is achieved by providing an electromagnetic wave radiation antenna and an electrode consisting of a dielectric and an earth electrode in a position opposite to a sample in a reactor. As the earth electrode can be provided in a position opposite to a sample as described above, bias is uniformly applied to a wafer and as a result, an etching rate in the center and the periphery of a wafer can be uniformed. If the above structure is provided, the shape of an antenna is not necessarily required to be planar and a conventional radial antenna and a conventional antenna in a comb shape may be used.

These and other objects and many of the attendant advantages of the invention will be readily appreciated as the same becomes better understood by reference to the following detailed description when considered in connection with the accompanying drawings.

DETAILED DESCRIPTION OF THE PREFERRED EMBODIMENTS

Figure 1:
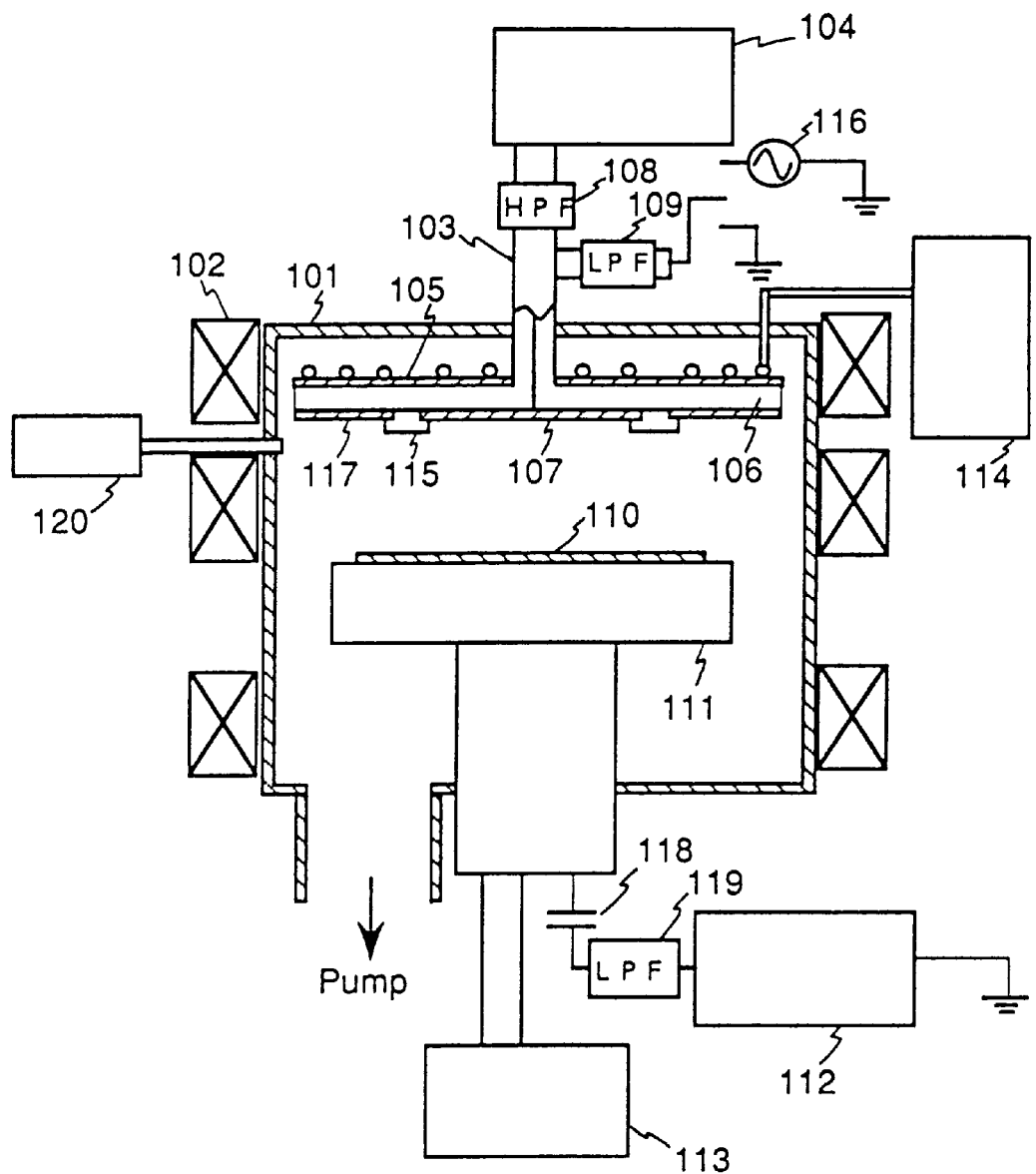
FIG. 1 is a schematic block diagram showing a plasma processing apparatus equivalent to a first embodiment according to the present invention.

Referring to the drawings, the embodiments of the present invention will be described in detail below.

<First Embodiment>

This first embodiment provides structure which charges source gas in a chamber by the synergistic effect between an electromagnetic wave in an ultra-high frequency band and a magnetic field and can control the state of a radical operating upon the surface of a processed sample by reaction with plasma on the surface of a conductive plate wherein the conductive plate is further installed in a position opposite to a processed sample. A function for causing the above reaction efficiently by further applying high frequency voltage can be also added to this conductive plate. A function for radiating an electromagnetic wave in the ultra-high frequency band and a function as a counter electrode of high frequency voltage applied to a processed sample are provided to this conductive plate.

FIG. 1 shows the constitution of an apparatus equivalent to this embodiment. As shown in FIG. 1, the internal space of a vacuum vessel 101 is exhausted by evacuation means not shown so that it is under low pressure and source gas is contained under predetermined pressure by source gas supplying means 120. A solenoid coil 102 is arranged around the vacuum vessel 101. An electromagnetic wave of 500 MHz is supplied in the vacuum vessel 101 by a power source 104 in the ultra-high frequency band via a coaxial line 103.

Figure 2:
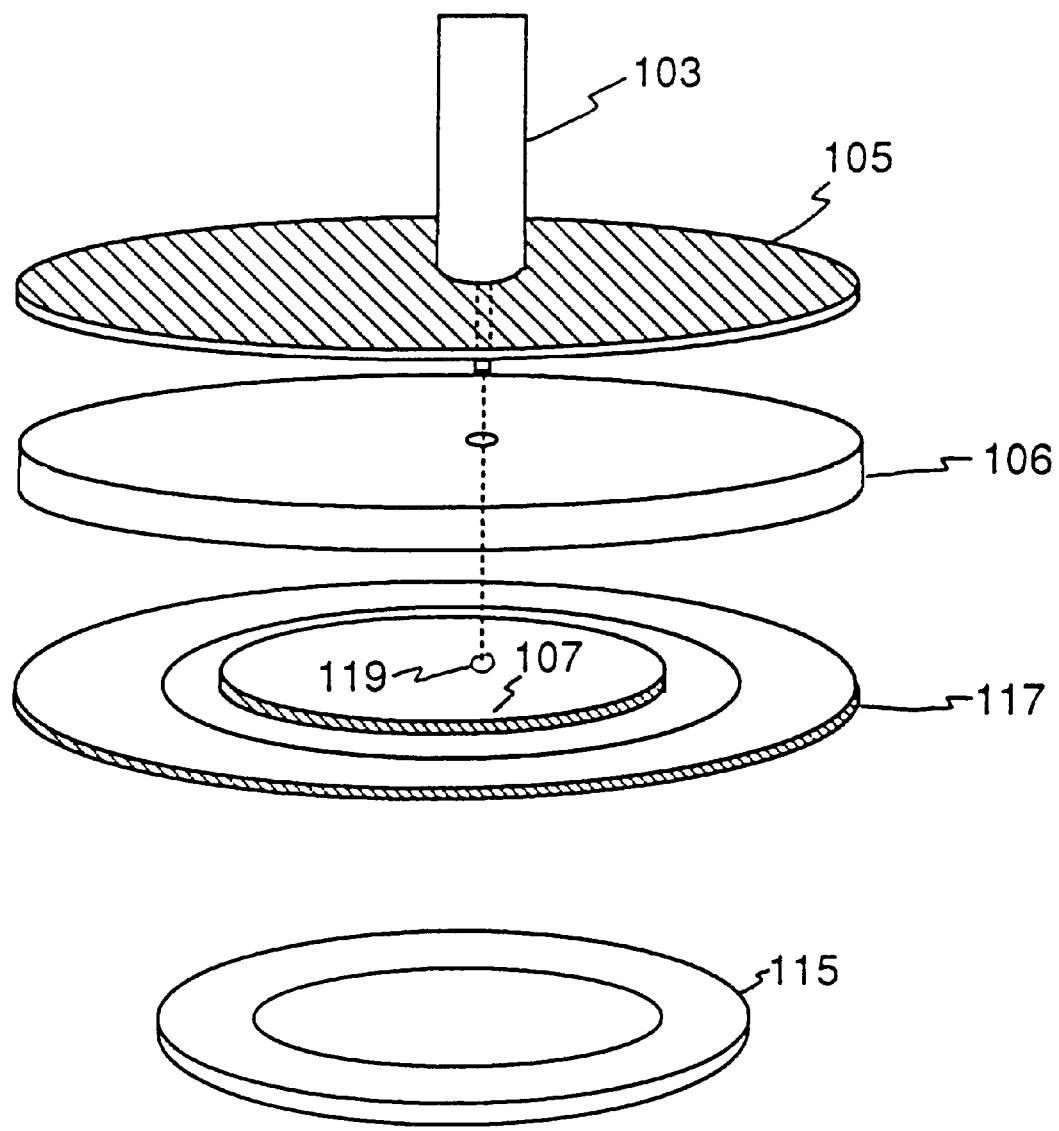
FIG. 2 explains the constitution of an electromagnetic wave radiator in the above first embodiment.

FIG. 2 shows the detailed constitution of a supplier of an electromagnetic wave in the ultra-high frequency band. An electromagnetic wave fed into the vacuum vessel is supplied to a graphitic circular conductive plate 107 installed closely on an earth electrode 105 via a dielectric 106 consisting of quartz. The diameter of the circular conductive plate 107 is set to a diameter in which the resonance mode of an electromagnetic wave can be obtained on this circular conductive plate. In this embodiment, the circular conductive plate 107 approximately 15 cm in diameter which can be excited in the TM11 mode is used. The TM11 mode is one of propagation types of an electromagnetic wave and is equivalent to a basic mode in the distribution of a standing wave in the lowest dimension of an electromagnetic wave formed between the circular conductive plate 107 and the earth electrode 105 in this embodiment. An electromagnetic wave in the ultra-high frequency band is fed to a point of the circular conductive plate 107 which is dislocated from the center of the circular conductive plate 107 as shown in FIG. 2. If an electromagnetic wave in an ultra-high frequency band is fed to the center of the circular conductive plate 107, an electromagnetic wave cannot be efficiently radiated in space because the node of a standing wave of electromagnetic wave voltage on the circular conductive plate is equivalent to the center. Therefore, in this embodiment, an electromagnetic wave in the ultra-high frequency band is fed to a point (feed point) 119 eccentric from the center of the circular conductive plate 107 as shown in FIG. 2 so as to obtain high electromagnetic wave radiation efficiency. As shown in FIG. 1, a high-pass filter 108 for passing a frequency in a frequency band of 100 MHz or more and a low-pass filter 109 for passing a frequency in a frequency band of 20 MHz or less are connected to the output side of the power source 104 in the ultra-high frequency band. The other end of the low-pass filter 109 is connected to earth potential or a high frequency power source 116 of 300 kHz. A high frequency power source 112 of 800 kHz is connected to a sample stand 111 for holding a processed sample 110 via a capacitor 118 and a low-pass filter 119.

Temperature control means 113 is provided to the sample stand 111 and is set so that a processed sample 110 is always at fixed temperature. In this embodiment, the temperature control means is set so that the temperature of a processed sample 110 is always approximately 60° C. The temperature of the circular conductive plate 107 for radiating an electromagnetic wave is also controlled by temperature control means 114 provided to the earth electrode 105. The periphery of the circular conductive plate 107 is covered with a ring 115 consisting of alumina. As the periphery of the circular conductive plate 107 is a position in which the electric field of an electromagnetic wave in the ultra-high frequency band is distributed strongest, local formation of plasma on the periphery of the circular conductive plate 107 can be prevented by this ring 115 and uniform plasma formation is enabled. In this embodiment the ring 115 is formed by alumina, however, as the ring 115 has only to be formed by material which can transmit an electromagnetic wave and hardly generates impurities that may cause a problem in processing a semiconductor device, the similar effect can be obtained even if quartz, silicon nitride, boron nitride, steatite or zirconia is used in addition to alumina. An earth plate 117 is provided on the periphery of the ring 115. Source gas is supplied into the vacuum vessel 101 by the source gas supplying means 120. In this embodiment, mixed gas of $C_4F_8$ and argon is used for source gas and is supplied into the vacuum vessel 101 under the pressure of 5 to 15 mTorr. In this embodiment, silicon oxide formed on the surface of a processed sample 110 is etched under the constitution of the above apparatus.

Next, the operation of the apparatus shown in FIG. 1 will be described. An electromagnetic wave for forming plasma is supplied from the power source 104 in an ultra-high frequency band to the graphitic circular conductive plate 107 via the coaxial line 103. The circular conductive plate 107 constitutes a microstrip-line resonator by being set on the earth electrode 105 via the dielectric 106. High frequency current efficiently flows on the surface of the circular conductive plate because of this resonator structure of the circular conductive plate 107 and an electromagnetic wave is radiated in space in which plasma is to be generated. Source gas is charged by interaction between an electromagnetic wave radiated from the circular conductive plate 107 as described above and a magnetic field generated by the solenoid coil 102. At this time, plasma can be efficiently formed by setting the magnetic field for a supplied electromagnetic wave of 500 MHz in the vacuum vessel 101 to magnitude (100 to 250 gauss) which meets the condition of electron cyclotron resonance.

Figure 3A:
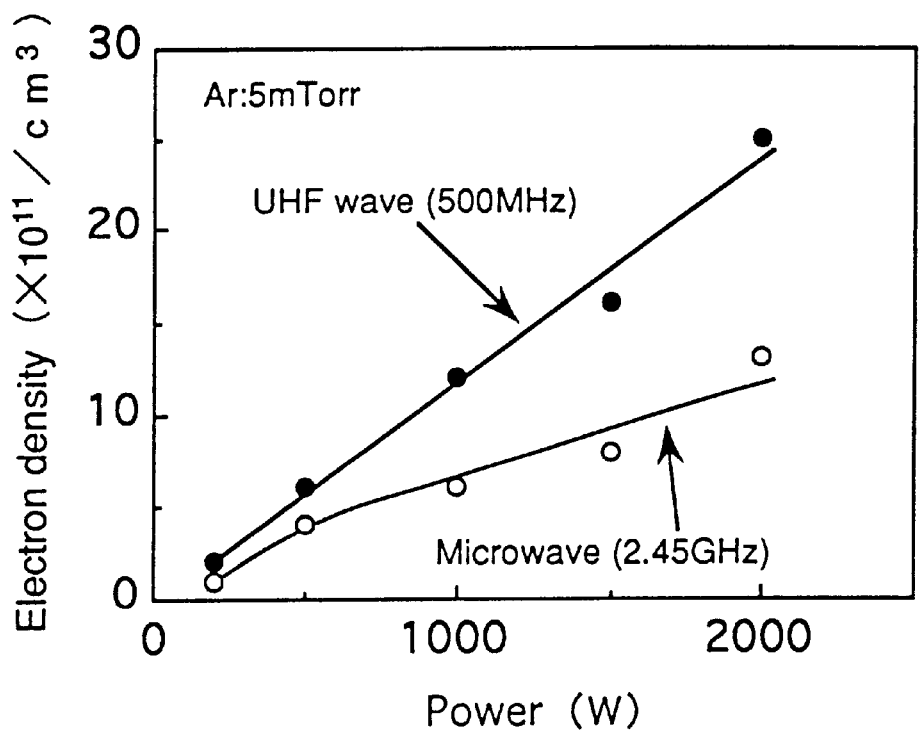
FIGS. 3(a) and 3(b) show the characteristics of ECR plasma by an electromagnetic wave in an ultra-high frequency band and a conventional microwave.
Figure 3B:
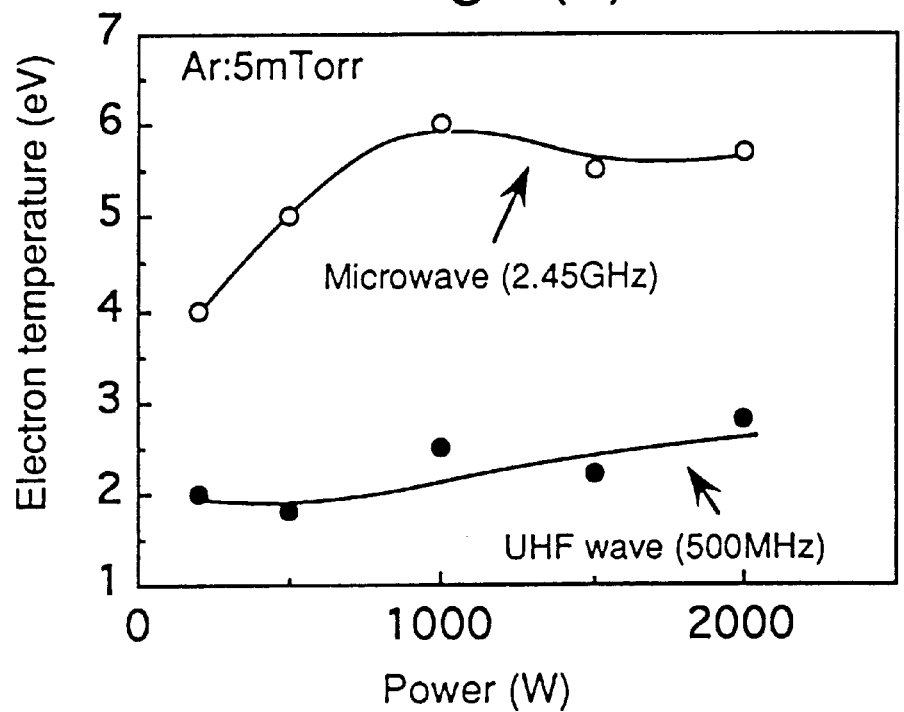

If plasma is formed utilizing an electron cyclotron resonance phenomenon caused by an electromagnetic wave in the ultra-high frequency band, the density of an electron can be enhanced, compared with plasma formed by a microwave of 2.45 GHz used for conventional electron cyclotron resonance-type plasma and a state in which the temperature of an electron is low can be realized as shown in FIGS. 3(a) and 3(b). Therefore, as the degree of dissociation of source gas in plasma depends upon the temperature of an electron, plasma in lower degree of dissociation can be formed. As electron cyclotron resonance is used for a mechanism for forming plasma, high density plasma under low gas pressure can be formed as the conventional electron cyclotron resonance type using a microwave. Hereby, a problem of the deterioration of the controllability of etching reaction by high degree of dissociation which is a problem in relation to a conventional high density plasma source can be solved.

Figure 16:
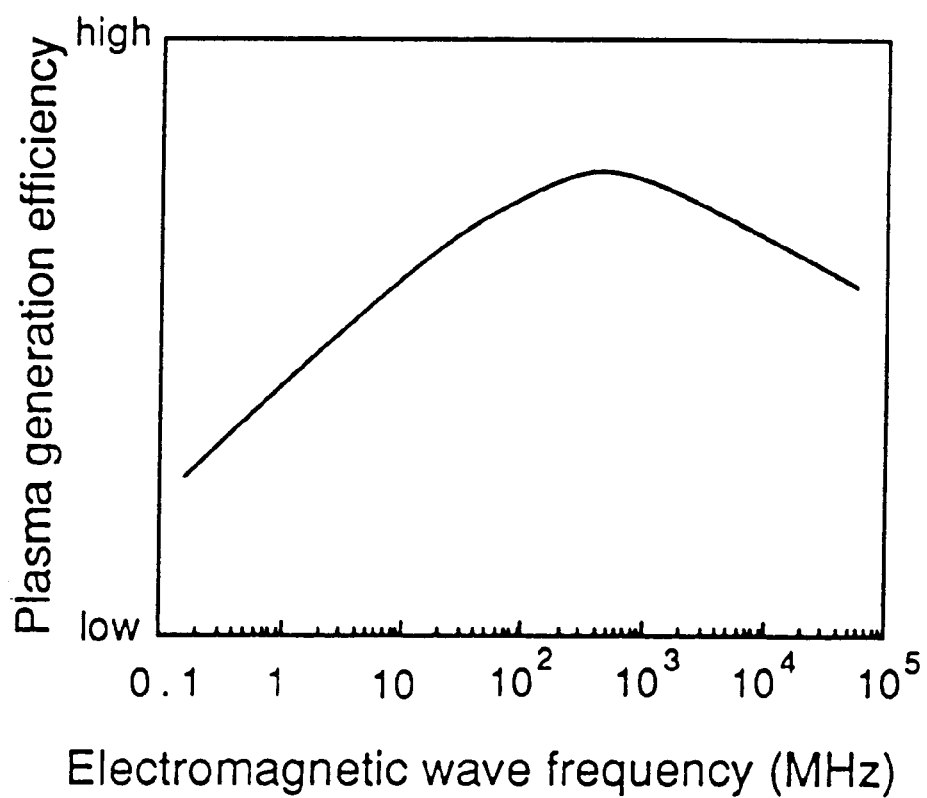
FIG. 16 shows the relationship between the frequency of an electromagnetic wave and the efficiency of generation of plasma.

Next, the generation efficiency of ECR plasma for an electromagnetic wave frequency will be described. Plasma generation efficiency is determined by balance between the generation rate and the loss rate of a charged particle (an electron and an ion). First, the generation rate of a charged particle will be described. The heating of ECR plasma under the gas pressure of 1 to a few tens mTorr is mainly classified into two types of heating by ECR and heating by the collision damping of an electron. The heating efficiency by ECR is determined by the size of an ECR area and the larger the area is, the higher heating efficiency can be obtained. The size of an ECR area is substantially in inverse proportion to the magnitude of a magnetic field slope and an electromagnetic wave frequency. Therefore, the heating efficiency by ECR is higher when an electromagnetic wave frequency is low. The heating efficiency by the collision damping of an electron depends upon the degree of the pursuit by an electron of the oscillation electric field of an electromagnetic wave. In the conventional microwave range used for ECR (for example, 2.45 GHz), an electron cannot sufficiently pursue the oscillation of an electromagnetic wave electric field because of the inertia of an electron and the heating efficiency is low. Therefore, the heating efficiency by collision damping is also higher when a frequency is low. However, as the loss of energy by the collision of an electron against a particle in a chamber and the wall of the vacuum vessel is increased and the heating efficiency is low if an electromagnetic wave frequency is too low, plasma heating by collision damping is performed most efficiently in the ultra-high frequency band according to the present invention. Next, the loss rate of a charged particle will be described. If an electromagnetic wave frequency is low, a magnetic field required for generating ECR plasma may be smaller. However, as a magnetic field closes plasma in space and deteriorates loss, the loss rate is accelerated in a low magnetic field and the generation rate of plasma is reduced. Therefore, it is described above that the generation rate is increased if an electromagnetic wave frequency is low and the lowness of an electromagnetic wave frequency is effective in plasma generation efficiency (however, in the case of collision damping, a reverse effect is produced when an electromagnetic wave frequency is too low), however, as the loss rate of a charged particle is also accelerated simultaneously, plasma generation efficiency is generated rather reduced. FIG. 16 shows this phenomenon as the relationship between ECR plasma generation efficiency and an electromagnetic wave frequency. If an electromagnetic wave frequency is low, plasma generation efficiency is deteriorated by the increase of the energy loss of an electron in collision damping and the decrease of the effect of closing plasma by the smallness of magnetic field strength and if an electromagnetic wave frequency is high, plasma generation efficiency is deteriorated by the decrease of an ECR area and the deterioration of the pursuit by an electron of the oscillation of an electromagnetic wave electric field. Therefore, the highest plasma generation efficiency can be obtained in the ultra-high frequency band between 300 and 1000 MHz as shown in FIG. 16 in an ECR system which enables satisfactory plasma generation even under low gas pressure. As not only high plasma generation efficiency can be obtained in the ultra-high frequency band as described above but required magnetic field strength may be lower, compared with that in the conventional microwave band, large power required for conventional magnetic field formation can be greatly saved. The height of plasma generation efficiency means that high plasma density can be maintained at low electron temperature and therefore, plasma formation controlling the dissociation of source gas is enabled.

Next, a method of controlling surface processing reaction by generated plasma will be described. As described above, plasma in the low degree of dissociation can be realized by generating electron cyclotron resonance plasma by an electromagnetic wave in the ultra-high frequency band according to the present invention. However, it is difficult to control reactive gas ideally in etching silicon oxide only by the low degree of dissociation. For example, if plasma is generated using fleon gas ($C_4F_8$ in this embodiment), reactive gas useful for etching silicon oxide is CF and $CF_2$. Even if such reactive gas can be generated relatively much by plasma in the low degree of dissociation, fluorine in a large quantity is generated. This fluorine mainly deteriorates etching selectivity for silicon in etching silicon oxide, resist and a nitride film and is not desirable as an etching condition. Therefore, the above apparatus is constituted according to the present invention so that its circular conductive plate 107 for radiating an electromagnetic wave is formed by graphite and the surface of the graphitic circular conductive plate and the above fluorine are reacted. The quantity of harmful fluorine is reduced by reacting the above fluorine with the surface of the graphitic circular conductive plate and the high etching selectivity of a processed sample can be realized by generating effective CF and $CF_2$ more. The effect of the above reaction on the surface of the graphite can be most effectively reflected in etching reaction on the surface of a processed sample 110 particularly by forming the circular conductive plate 107 opposite to the surface of the processed sample 110 by graphite. Uniform plasma formation is enabled even in a state in which a processed sample 110 and the circular conductive plate 107 are close (a state in which the effect of the above reaction on the surface of the circular conductive plate 107 can be most efficiently reflected in etching reaction on the surface of the processed sample) by forming a magnetic field for electron cyclotron resonance between the processed sample 110 and the circular conductive plate 107 by regulating magnetic field strength by the solenoid coil 102. In this embodiment, distance between a processed sample 110 and the circular conductive plate 107 can be varied between 2 and 30 cm so that the distance can be regulated in a position in which the uniformity of plasma and the efficiency of reflecting reaction on the surface of the circular conductive plate 107 in reaction on the surface of the processed sample can be compatible. The temperature of the circular conductive plate 107 for radiating an electromagnetic wave is controlled by the temperature control means 114 provided to the earth electrode 105 so that it is always fixed and reaction on the surface of the circular conductive plate 107 can be stabilized thereby. In this embodiment, the circular conductive plate 107 is grounded via the low-pass filter 109. Hereby, the circular conductive plate 107 functions for a high frequency of 800 kHz applied to the sample stand 111 as an earth electrode and the uniformity of bias applied to a processed sample 110 is also enabled. In this embodiment the circular conductive plate 107 is formed by graphite, however, the effect of consuming fluorine is also produced by using silicon and the similar reaction control effect can be obtained. In this embodiment source gas generated by adding oxygen to the main gas of $C_4F_8$ is used for etching silicon oxide, however, it need scarcely be said that if $CF_4$, $C_2F_6$, $CF_3$, $CH_2F_2$, $CH_3F$ and others are used for main gas, the similar effect can be also obtained. If hydrogen, CO, rare gas and others are used for additive gas in addition to the above oxygen, the similar effect can be also obtained.

In this embodiment, an electromagnetic wave the frequency of which is 500 MHz is used for an electromagnetic wave in the ultra-high frequency band, however, if an electromagnetic wave with an arbitrary frequency between 300 MHz and 1 GHz is used, the similar effect to that shown in FIGS. 3(*a*) and 3(*b*) can be also obtained. The wavelength of an electromagnetic wave between 300 MHz and 1 GHz is approximately 30 to 80 cm, it is substantially equal to the diameter of the vacuum vessel of a plasma processing apparatus with a large bore diameter for a wafer 8 inches or more in diameter, particularly 12 inches or more in diameter and the apparatus is suitable for processing the surface of a wafer with a large diameter. In the constitution of an apparatus according to this embodiment, a standing wave in a higher mode which causes the instability and the unevenness of plasma is hardly generated in the vacuum vessel and further, magnetic field strength required for forming plasma may be also smaller, compared with that in case a conventional microwave is used. If plasma is generated using an electromagnetic wave in the ultra-high frequency band as described above, a plasma processing apparatus suitable for processing a wafer with a large diameter can be realized at low costs. Therefore, according to the present invention, an electromagnetic wave in the ultra-high frequency band between 300 MHz and 1 GHz is used for generating plasma.

In this embodiment, the frequency of high frequency voltage applied to a processed sample 110 is 800 kHz, however, the similar effect can be also obtained by high frequency voltage with an arbitrary frequency between 100 kHz and 20 MHz.

In this embodiment, the dielectric 106 provided between the circular conductive plate 107 and the earth electrode 105 is formed by quartz, however, if alumina, silicon nitride, boron nitride, silicon carbide, zirconia, Pyrex glass, Teflon and others are used in addition, the similar effect can be also obtained.

In this embodiment, a case of etching silicon oxide is described, however, this embodiment can be also applied to a case of etching aluminum, silicon, tungsten and others by forming the circular conductive plate 107 by any of silicon, graphite, aluminum and stainless and further using chlorine gas for source gas.

Further, in this embodiment, a radical is controlled by reaction on the surface of the circular conductive plate 107 arranged in a position opposite to the surface of a sample 110, however, the similar control of a radical is also enabled by forming a half or more of the wall of the vacuum vessel which is in contact with plasma by the same material. At this time, the precise control of a radical is enabled by setting high frequency voltage applying means and the temperature control means on the wall of the vessel. It is also suitable for efficiently accelerating an ion and promoting reaction in this case that high frequency voltage applied to the wall of the vessel is in the range of 100 kHz to 20 MHz as high frequency voltage applied to a processed sample. However, if the frequency of high frequency voltage applied to the wall of the vessel is not twice as low as that of high frequency voltage applied to a processed sample 110 or lower, the design of a filter is difficult and the mutual power sources are influenced. Therefore, it is desirable that, for example the frequency of first high frequency voltage applied to a processed sample 110 is 800 kHz and that of second high frequency voltage applied to the wall of the vessel is 300 kHz, a half or less of the frequency of the above first high frequency voltage. This is also similar in relation to high frequency voltage applied to the above circular conductive plate 107 at the same time as an electromagnetic wave in the ultra-high frequency band and it is required that the frequency of the high frequency power source 116 is also in the range of 100 kHz to 20 MHz and the frequency of high frequency voltage applied to the wall of the vessel is twice as low as that of high frequency voltage applied to a processed sample or lower.

Figure 4A:
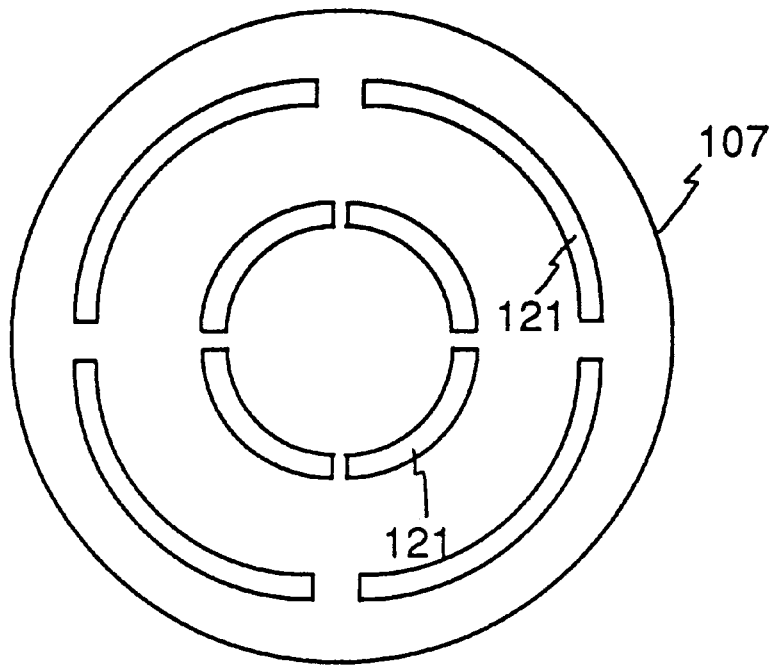
FIGS. 4(a) and 4(b) explain the constitution if a slit is formed on a circular conductive plate in the first embodiment.
Figure 4B:
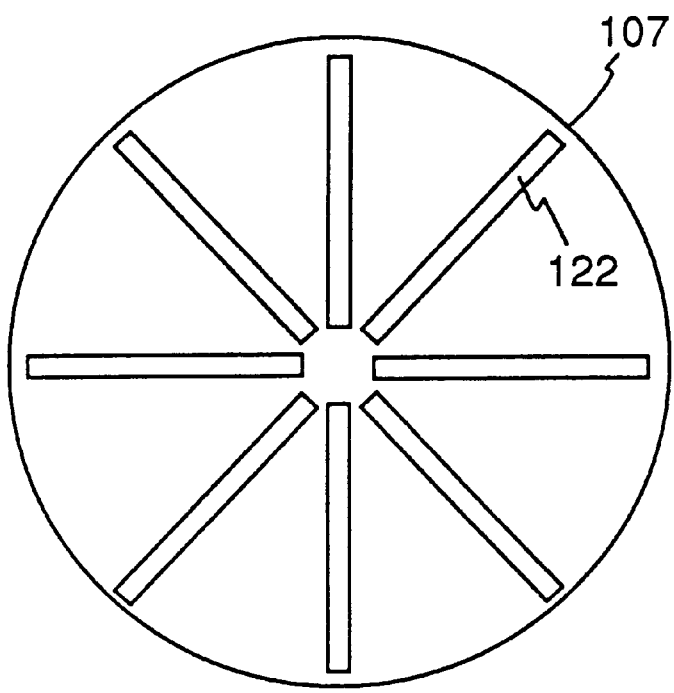

In this embodiment, the similar effect can be also obtained if slits 121 and 122 shown in FIGS. 4(*a*) and 4(*b*) are formed on the circular conductive plate 107 and plasma is generated using an electromagnetic wave radiated through these slits and further, more even plasma can be generated by optimizing the size and the number of these slits.

<Second Embodiment>

Figure 5:
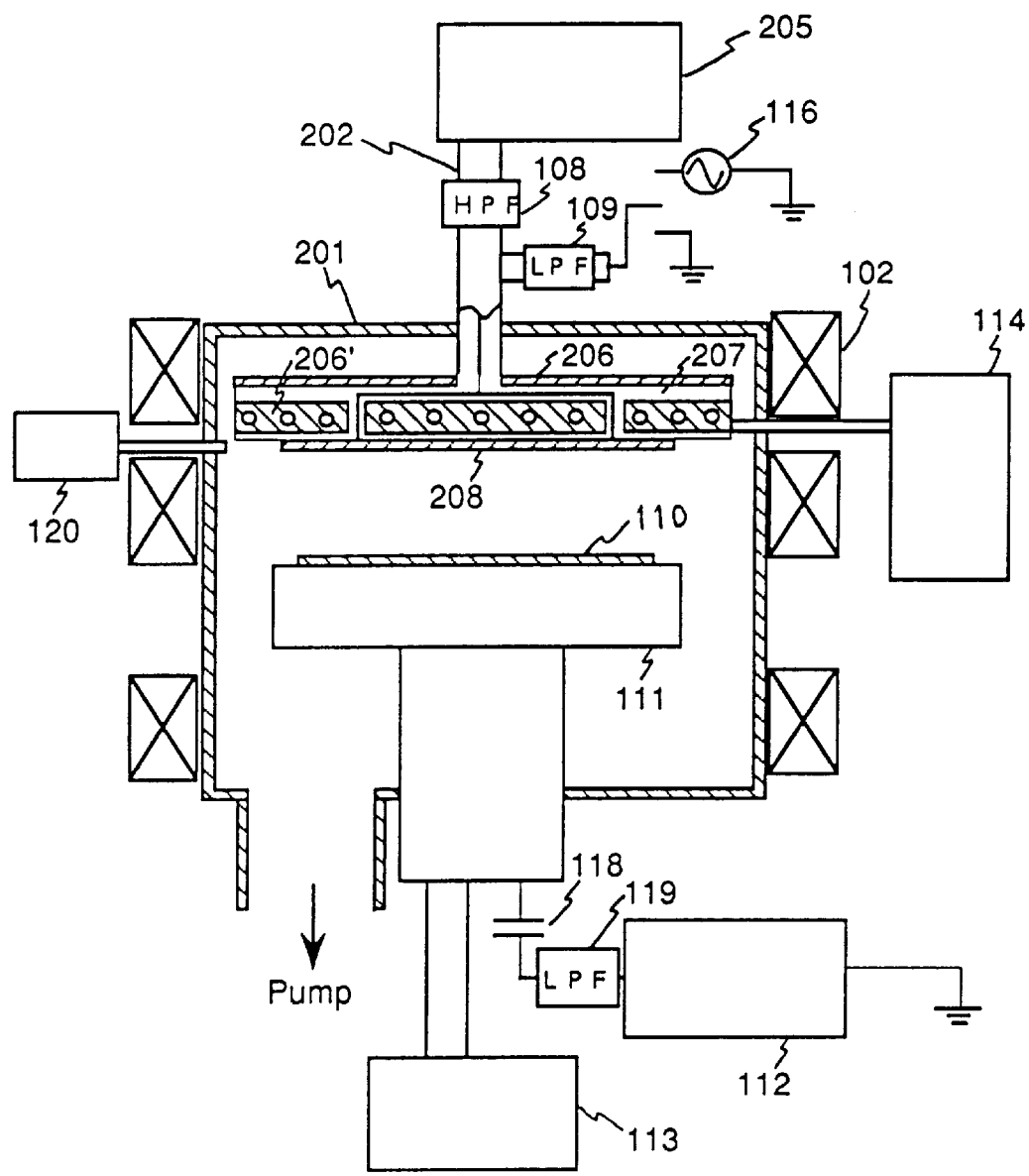
FIG. 5 is a schematic block diagram showing a plasma processing apparatus equivalent to a second embodiment according to the present invention.

FIG. 5 shows the constitution of an apparatus equivalent to a second embodiment. This embodiment is characterized in that a method of supplying an electromagnetic wave to a circular conductive plate as the electromagnetic wave radiation antenna in the above first embodiment is devised and an electromagnetic wave radiated from the circular conductive plate is a circularly polarized wave which is efficient in generating plasma. As the rough constitution of the apparatus is similar to that shown in FIG. 1 related to the first embodiment, only a different supplier of an electromagnetic wave will be described here.

Figure 6:
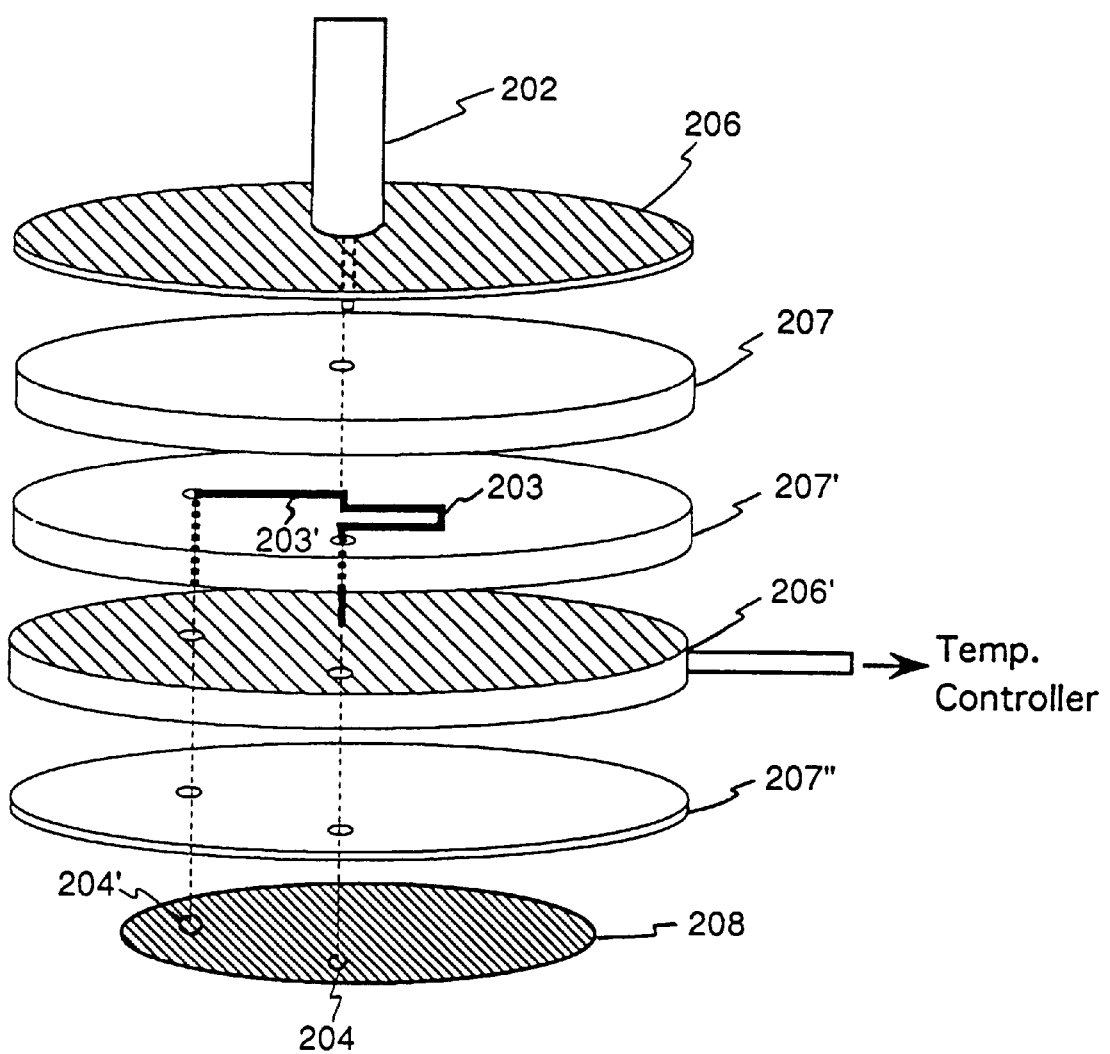
FIG. 6 explains the constitution of an electromagnetic wave radiator in the above second embodiment.

An electromagnetic wave of 500 MHz is supplied from a power source 205 in an ultra-high frequency band into a vacuum vessel 201 via a coaxial line 202. The electromagnetic wave fed into the vacuum vessel is supplied on a graphitic circular conductive plate 208 installed on an earth electrode 206 via dielectrics formed by quartz 207, 207' and 207" and an earth electrode 206' connected to temperature control means. The electromagnetic wave is supplied to two feed points 204 and 204' on the circular conductive plate 208 by dividing the electromagnetic wave from the coaxial line 202 into two systems of transmission lines 203 and 203' and extending one transmission line 203 by ¼ wave length than the other transmission line 203' as shown in FIG. 6. The phase of an electromagnetic wave supplied to the circular conductive plate 208 can be shifted by 90 degrees by shifting the length of the transmission lines 203 and 203' for an electromagnetic wave as described above by ¼ wave length. Electromagnetic waves the phases of which are shifted by 90 degrees are synthesized on the circular conductive plate 208, a rotary magnetic field is formed, and the electromagnetic waves become circularly polarized waves which enable more efficient generation of plasma and are radiated from the circular conductive plate 208 into the space inside the vessel. As in the first embodiment shown in FIG. 1, the diameter of the circular conductive plate 208 is set to a diameter in which a resonance mode of electromagnetic waves can be obtained on the circular conductive plate 208. In this embodiment, a circular graphitic plate approximately 15 cm in diameter which enables excitation in TM11 mode is used as in the first embodiment shown in FIG. 1.

The other operation and the detailed constitution of an apparatus equivalent to this embodiment are the same as those in the first embodiment shown in FIG. 1.

<Third Embodiment>

Figure 7:
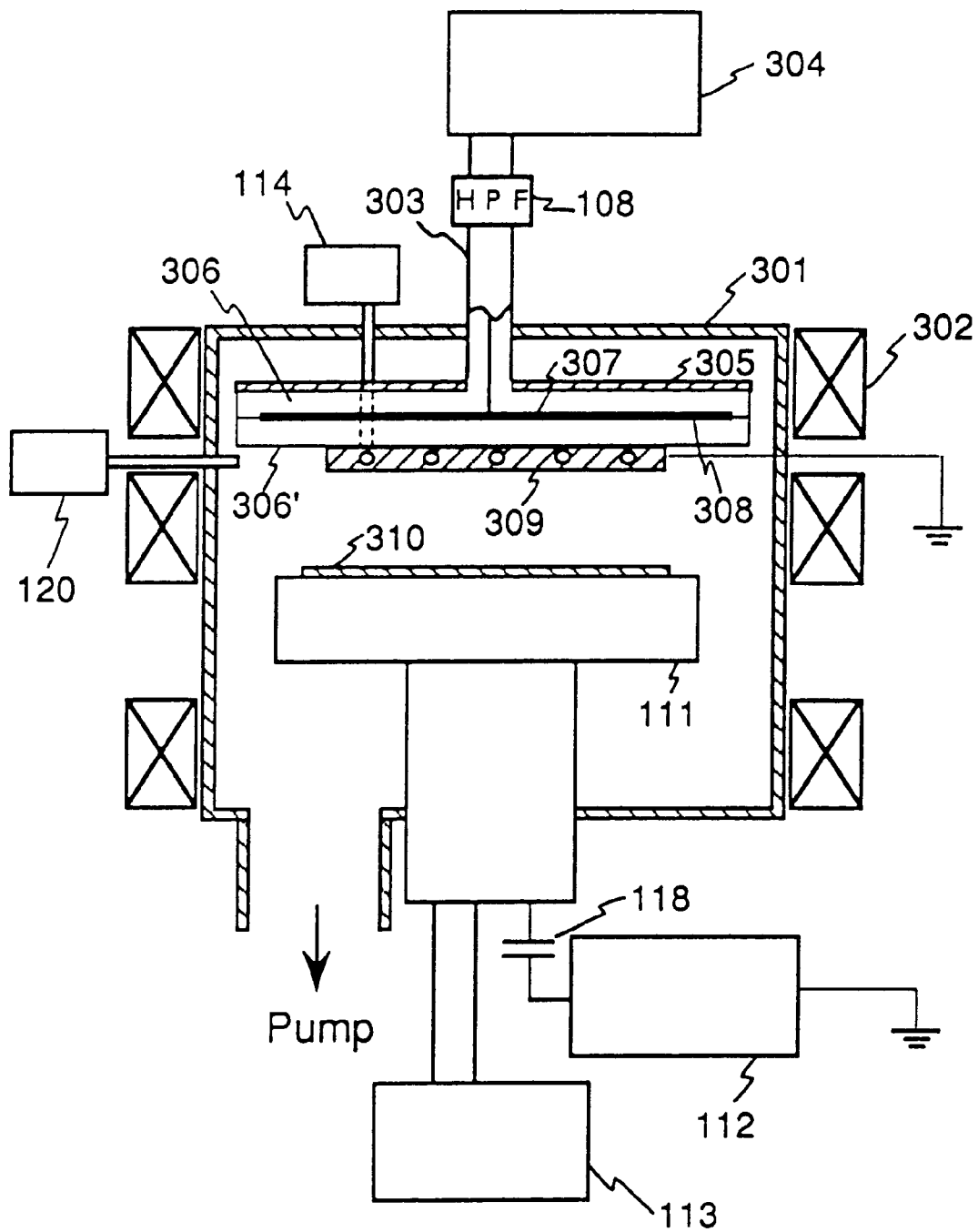
FIG. 7 is a schematic block diagram showing a plasma processing apparatus equivalent to a third embodiment according to the present invention.
Figure 8:
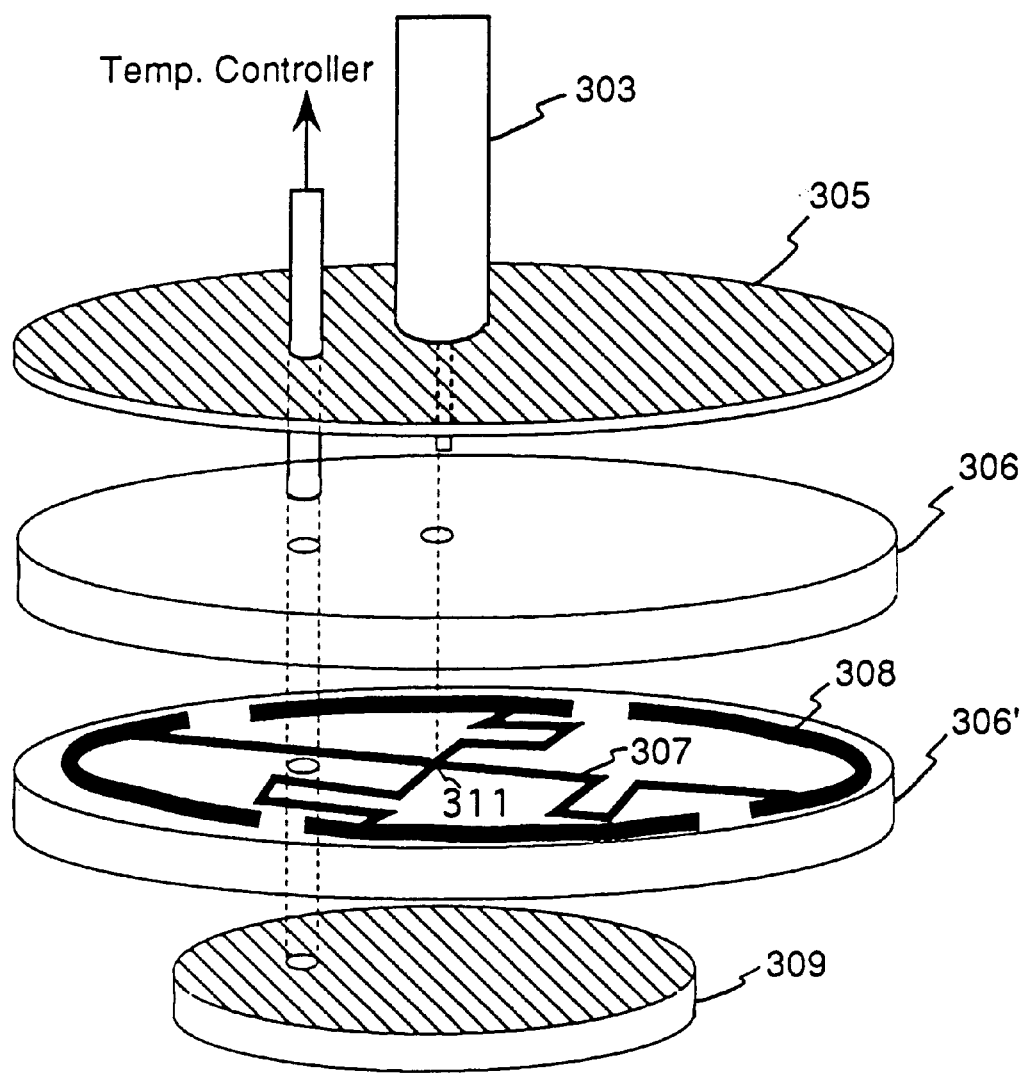
FIG. 8 explains the constitution of an electromagnetic radiator in the above third embodiment.

FIG. 7 shows the constitution of an apparatus equivalent to a third embodiment. In this embodiment, a method of radiating an electromagnetic wave in an ultra-high frequency band for generating plasma is mainly different from that in the above first and second embodiments. In this third embodiment, a solenoid coil 302 is arranged around a vacuum vessel 301 as in the first embodiment shown in FIG. 1. An electromagnetic wave of 500 MHz is supplied from a power source 304 in the ultra-high frequency band into the vacuum vessel 301 via a coaxial line 303. The electromagnetic wave fed into the vacuum vessel 301 is supplied to an electromagnetic wave radiation antenna 308 arranged around a microstrip-line 307 through it provided on an earth electrode 305 via dielectric plates 306 and 306' formed by quartz. A graphitic circular earth electrode 309 is arranged in the center on the electric plate 306'. FIG. 8 shows the detailed structure of the electromagnetic wave radiation antenna 308. The outside conductor of the coaxial line 303 is connected to the earth electrode 305 and the inside conductor (the core) is connected to four microstrip-lines 307 at a feed point 311. These four microstrip-lines 307 are respectively connected to each of the electromagnetic wave radiation antenna 308 divided into four. The length of each part of the electromagnetic wave radiation antenna 308 is set to integral times as long as ½ wave length (the wavelength in the dielectric plate 306) of a supplied electromagnetic wave. In this embodiment, the length of each antenna part is set to approximately 15 cm equivalent to ½ wave length. The length of four microstrip-lines connecting between the coaxial line 303 and each antenna part is varied respectively by ¼ wave length. Hereby, an electromagnetic wave the phase of which is shifted by 90 degrees can be supplied to each antenna part and a reflective electromagnetic wave from each antenna part is set off at the feed point 311. An electric field generated by synthesizing electromagnetic waves radiated from each antenna part is a rotary electric field and plasma generation efficiency is enhanced by interaction between the rotary electric field and a magnetic field generated by the solenoid coil 302.

In this embodiment, the graphitic circular conductive plate 309 functions as a reaction control function and an earth electrode for high frequency voltage applied to a processed sample 310 in the first embodiment shown in FIG. 1. These functions of the reaction control function and the earth electrode are the same as those described in relation to the above first embodiment shown in FIG. 1. However, as the graphitic circular conductive plate 309 in this embodiment is not required to radiate an electromagnetic wave, a temperature control mechanism and a gas supplying mechanism can be readily formed directly on the circular conductive plate 309 and therefore, there is an advantage that the stability of reaction on this circular conductive plate 309 can be enhanced. The similar reaction control is also enabled if this circular conductive plate 309 is formed by silicon in plate of graphite as in the first embodiment shown in FIG. 1. Further, as in the first embodiment shown in FIG. 1, high frequency voltage of 100 kHz to 20 MHz is applied to the circular conductive plate 309 as vias voltage and the quantity of reaction and a reaction mechanism on the surface of the circular conductive plate can be also controlled by the bias effect.

In this embodiment, a radical is controlled by reaction on the surface of the circular conductive plate 309 arranged opposite to the surface of a sample 310, however, the similar control of a radical is also enabled if a half or more of the inner wall of vacuum vessel which is in contact with plasma is formed by the similar material. At this time, the precise control of a radical is also enabled by adding bias applying means and temperature control means on the above inner wall.

The above microstrip-line normally denotes a conductive line formed by a thin film on the earth electrode via a dielectric film and is provided to carry high frequency power. In this embodiment, an electromagnetic wave is supplied to each antenna part using this microstrip-line.

<Fourth Embodiment>

Figure 9:
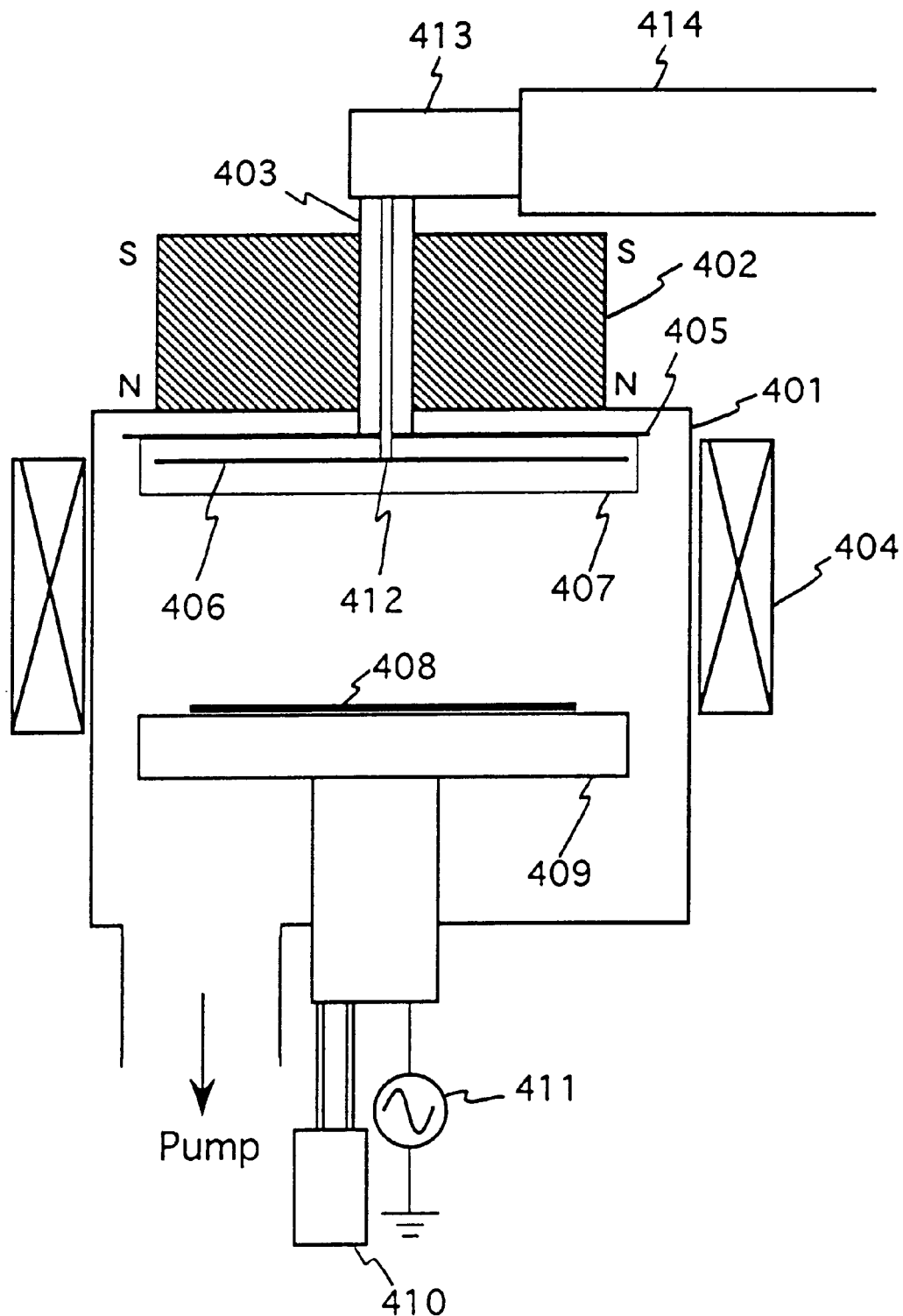
FIG. 9 is a schematic block diagram showing a plasma processing apparatus equivalent to a fourth embodiment according to the present invention.

FIG. 9 shows the constitution of an apparatus equivalent to a fourth embodiment. This embodiment is different from the first embodiment in that a permanent magnet is used for generating a magnetic field. A permanent magnet 402 with the diameter of 30 cm and the thickness of 10 cm the surface magnetic flux density in the center of which is 1,000 gauss is installed outside the upper part of a cylindrical vacuum vessel 401. The permanent magnet 402 can be moved in the axial direction (upward and downward) of the cylindrical vacuum vessel 401 and is constituted so that the distribution of a magnetic field in the vacuum vessel 401 can be controlled by shifting the axial position of the permanent magnet 402. A through hole in the axial direction approximately 4 cm in diameter is provided in the center of the permanent magnet 402 and an electromagnetic wave of 500 MHz is supplied into the vacuum vessel 401 via a coaxial line 303 through the through hole. A solenoid coil 404 is installed on the periphery of the cylindrical vacuum vessel 401 and the distribution of a magnetic field generated by the permanent magnet 402 can be controlled by a magnetic field generated by the solenoid coil 404. The outside conductor of the coaxial cable 403 led into the vacuum vessel 401 is connected to an earth electrode 405 in a planar shape and the inside conductor (the core) is connected to the center (a feed point) 412 of a radial strip-line 406 arranged close to the earth electrode 405 in a planar shape in parallel with it. Electromagnetic wave power is supplied from the other end of the coaxial line 403 via a waveguide 414 and a coaxial transducer 413 from an electromagnetic wave oscillator not shown.

Figure 10A:
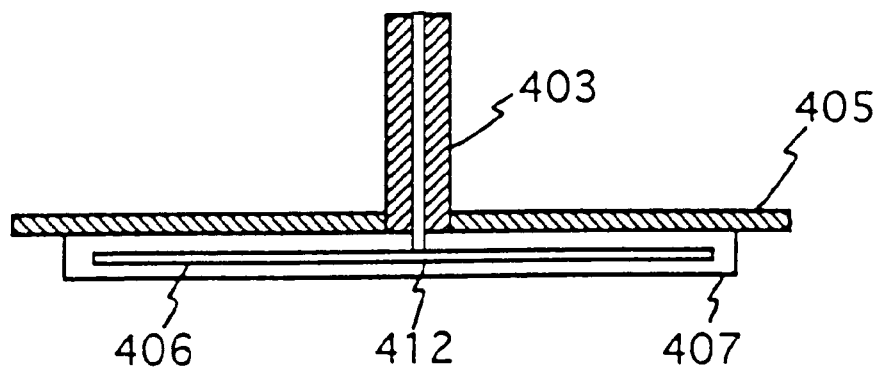
FIG. 10(a) explains the constitution of an electromagnetic radiator in the above fourth embodiment.
Figure 10B:
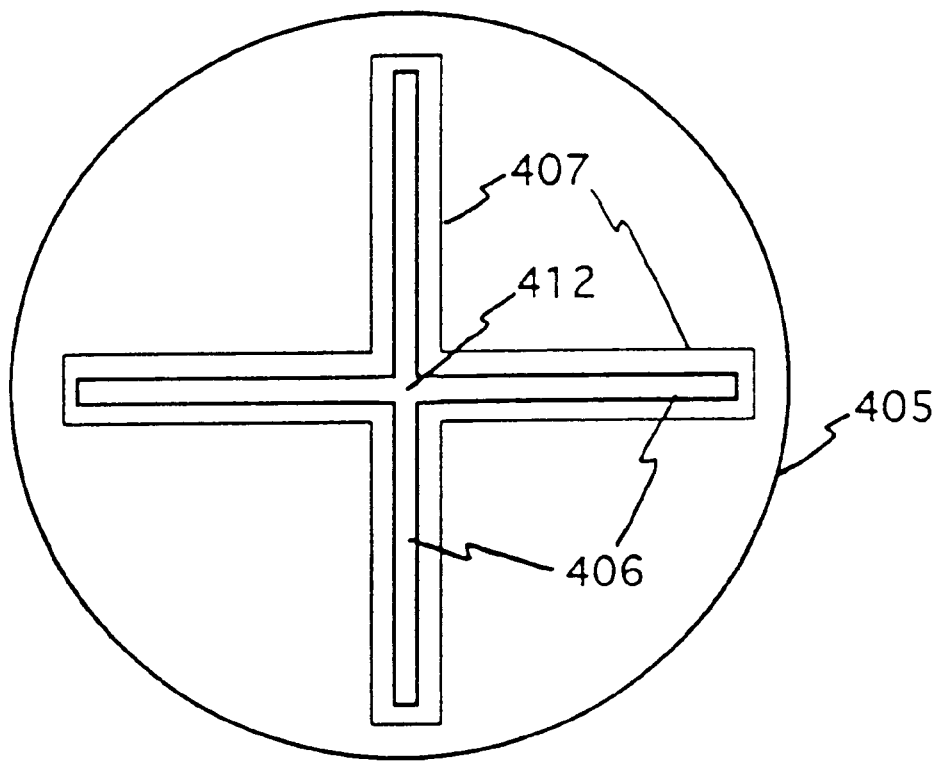
FIG. 10(b) is a bottom view of a part thereof.

FIGS. 10(a) and 10(b) show the detailed structure of the radial strip-line 406. In this embodiment, four strip-lines 406 are arranged radially at an equal angle from the central point (the feed point) 412. The overall radial strip-lines 406 are coated with quartz glass 407.

As shown in FIG. 9, a sample stand 409 is provided in the vacuum vessel 401 and a sample temperature control mechanism 410 and high frequency bias applying means 411 are added to the sample stand 409. A processed sample (a wafer 20 cm in diameter) 408 is loaded onto the sample stand 409. An electromagnetic wave supplied from the coaxial cable 403 to the feed point 412 is radiated in the direction of the processed sample 408, being propagated between the radial strip-lines 406 and the earth electrode 405 in a planar shape. Hereby, an electromagnetic wave can be uniformly radiated in the wide range of the vacuum vessel 401 and uniform plasma can be generated.

Next, the operation of the apparatus shown in FIG. 9 will be described. An electron cyclotron resonance magnetic field (approximately 178 gauss if the frequency of a used electromagnetic wave is 500 MHz) is formed in the vicinity of the upper part of a processed sample 408 in the vacuum vessel 401 by the permanent magnet 402 and the solenoid coil 404. This magnetic field is mainly generated by the permanent magnet 402 and a magnetic field generated by the solenoid coil 404 plays an auxiliary role for focusing the magnetic flux of the permanent magnet 402 which rapidly tries to diverge. Therefore, current for exciting the solenoid coil 404 can be reduced. An electromagnetic wave supplied to the feed point 412 via the coaxial cable 403 is radiated in space over a sample 408, being propagated radially along the four radial strip-lines. At this time, the efficient propagation and radiation of an electromagnetic wave can be realized by setting the respective length of the radial strip-lines 406 to the length in the range of −20% of integral times as long as ½ wave length of a used electromagnetic wave. Source gas supplied into the vacuum vessel 401 is efficiently charged by interaction between an electromagnetic wave radiated from these radial strip-lines and the above magnetic field.

As an electromagnetic wave is radiated into the vacuum vessel 401 via the radial strip-lines 406 as described above, it can be uniformly radiated into a vacuum vessel with a large bore diameter according to the length of each of the strip-lines 406 and uniform plasma with a large diameter can be generated. In this embodiment, as a magnetic field for generating plasma is mainly generated by the permanent magnet, power consumed by an electromagnet (the solenoid coil) which is a problem in a conventional apparatus can be greatly reduced. As the permanent magnet with a large bore diameter is used, electron cyclotron resonance can be generated closer to the surface of a processed sample so as to generate plasma and further, the density of an ion and a radical which is enough to absorb microwave power in limited space between a position from which an electromagnetic wave is supplied and a position for electron cyclotron resonance can be realized. An ion in plasma is accelerated by applying high frequency bias to a processed sample 408 by the high frequency bias applying means 411 and can be incident to the processed sample 408. Hereby, as plasma is in contact with the earth electrode 405 in a planar shape installed in a position opposite to the surface of a sample 408, a problem of the unevenness of high frequency bias on the surface of the sample in a conventional apparatus can be solved and therefore, sample surface processing by uniform plasma is enabled.

<Fifth Embodiment>

Figure 11A:
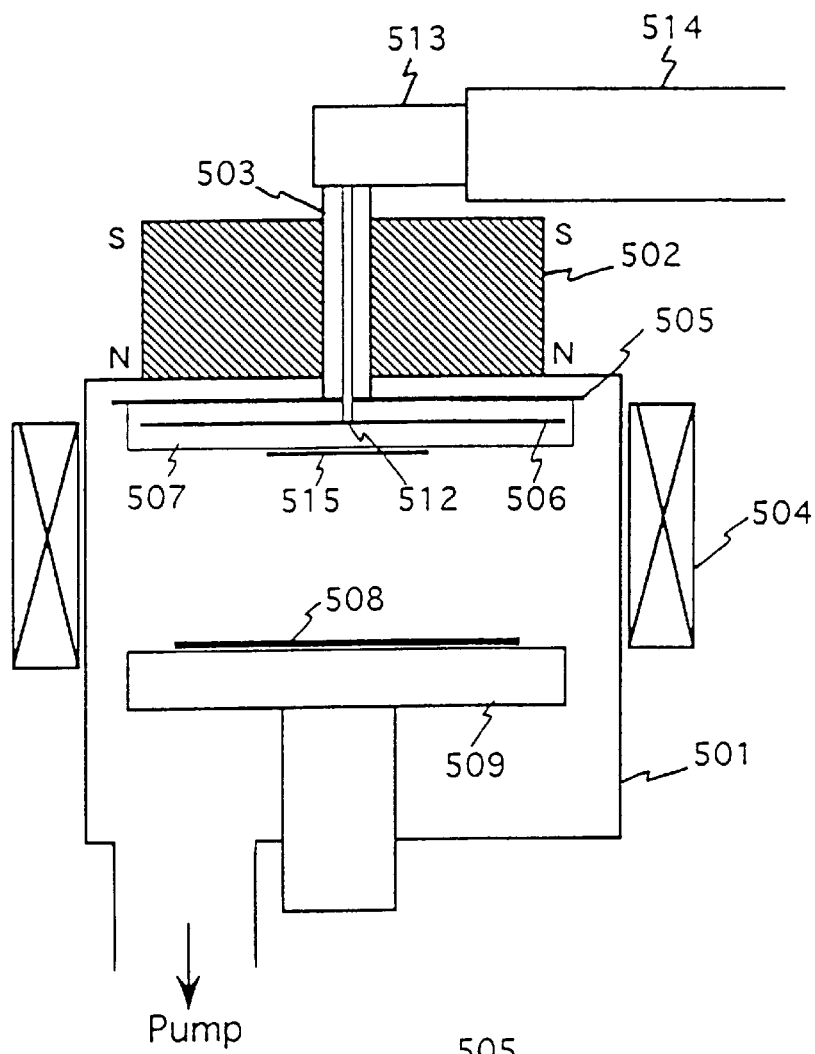
FIG. 11(a) is a schematic block diagram showing a plasma processing apparatus equivalent to a fifth embodiment according to the present invention.
Figure 11B:
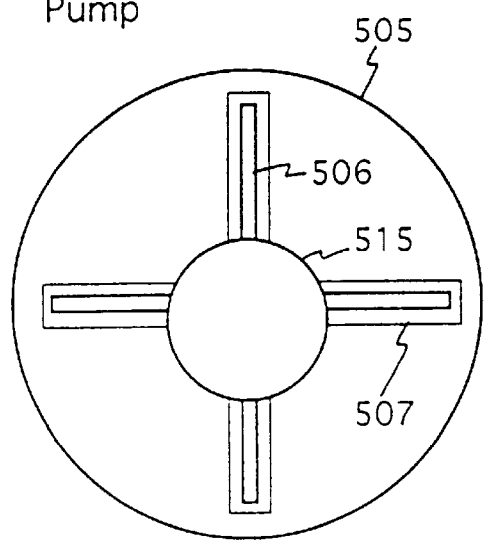
FIG. 11(b) is a bottom view of a part thereof.

FIGS. 11(a) and 11(b) show the constitution of an apparatus equivalent to a fifth embodiment. The basic constitution of an apparatus equivalent to this embodiment is substantially the same as that in the above fourth embodiment. That is, as shown in FIG. 11a, a permanent magnet 502 is provided on a cylindrical vacuum vessel 501 in the axial direction and a main magnetic field for generating plasma is generated in the vacuum vessel 501 by this permanent magnet. A solenoid coil 504 provided on the periphery of the cylindrical vacuum vessel 501 functions as auxiliary magnetic field generating means for controlling the distribution of a magnetic field generated by the permanent magnet 502. An electromagnetic wave for generating plasma is supplied from an electromagnetic wave oscillator not shown to each radial strip-line 506 via a waveguide 514, a coaxial transducer 513 and a coaxial cable 503 and is radiated from there into the cylindrical vacuum vessel 501. The radial strip-line 506 is provided on an earth electrode in a planar shape 505 via quartz glass 507. As described in relation to the above fourth embodiment, means for applying high frequency bias to a processed sample 508 and a sample temperature control (cooling) mechanism are provided to a sample stand 509, however, they are not shown in FIGS. 11(a) and 11(b) for simplification.

In this embodiment, a disk-shaped conductive plate 515 is installed close to the center (a feed point) 512 of the radial strip-line 506 on the side of a processed sample 508 to prevent an electromagnetic wave from being focused on the center of the vessel as in the above fourth embodiment and as a result, the uniformity of generated plasma is enhanced. Generally, the density of plasma generated in the vacuum vessel is low in its periphery and is high in its center in the radial direction of the vacuum vessel because of damping against the wall of the vessel. Therefore, in this embodiment, the uniformity of generated plasma is realized by controlling the radiation of an electromagnetic wave from the central part of the radial strip-line 506 in the radial direction of the vacuum vessel 501 by a disk-shaped conductive plate 515. Further, the disk-shaped conductive plate 515 can function as an earth electrode for high frequency bias voltage applied to a processed sample 508 by grounding the disk-shaped conductive plate 515 as in the above first to fourth embodiments and further, the above reaction control function can be provided to the disk-shaped conductive plate 515 by forming it by material such as graphite as in the above first to fourth embodiments.

<Sixth Embodiment>

Figure 12:
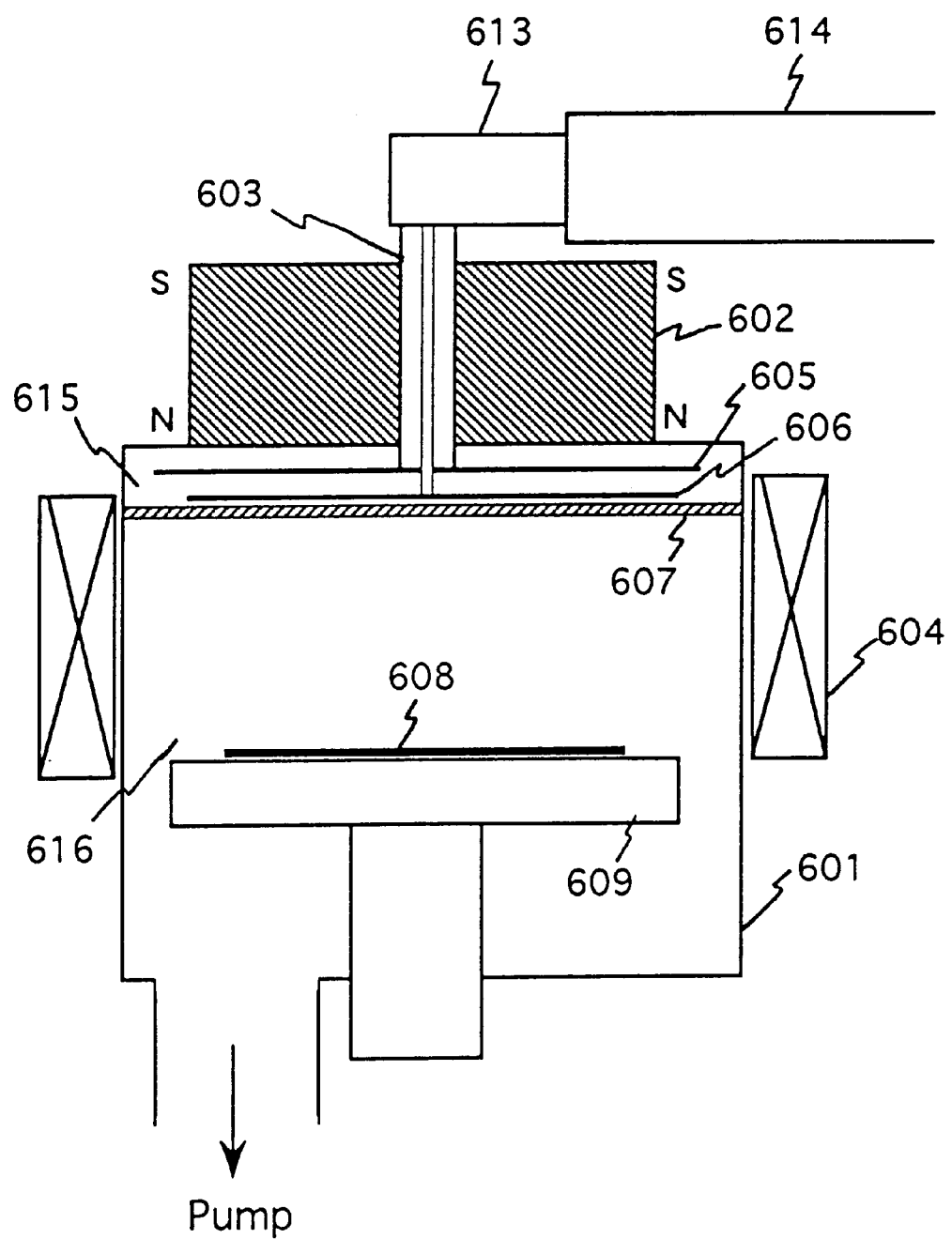
FIG. 12 is a schematic block diagram showing a plasma processing apparatus equivalent to a sixth embodiment according to the present invention.

FIG. 12 shows the constitution of an apparatus equivalent to a sixth embodiment. The basic constitution of an apparatus equivalent to this embodiment is also substantially the same as that in the above fourth embodiment. That is, as shown in FIG. 12, a permanent magnet 602 is provided on a cylindrical vacuum vessel 601 in the axial direction and a main magnetic field for generating plasma is generated in the vacuum vessel 601 by this permanent magnet. A solenoid coil 604 provided on the periphery of the cylindrical vacuum vessel 601 is provided to control the distribution of the magnetic field generated by the permanent magnet 602. An electromagnetic wave for generating plasma is supplied from an electromagnetic wave oscillator not shown to a radial strip-line 606 via a waveguide 614, a coaxial transducer 613 and a coaxial cable 603 and is fed from there into space 616 inside the vacuum vessel 601. The radial strip-line 606 is provided minutely apart from an earth electrode in a planar shape 605 in parallel with it. As in the above fourth embodiment, means for applying high frequency bias to a processed sample 608 and a sample temperature control mechanism are provided to a sample stand 609, however, they are not shown in FIG. 12 for simplification.

This embodiment is different from the above fourth embodiment in that an electromagnetic wave radiator formed by the radial strip-line 606, the earth electrode 605 and others is installed in a place which is not vacuum. That is, in this embodiment, space (atmospheric pressure) 615 in which the electromagnetic wave radiator consisting of the earth electrode 605 and others is installed is partitioned from space (vacuum) 616 inside the vacuum vessel 601 by an airtight quartz window 607 and an electromagnetic wave radiated from the radial strip-line 606 passes through this quartz window 607 and is fed into the space 616 inside the vacuum vessel 601. According to such constitution, as no vacuum sealing means for leading particularly the coaxial cable 603 from outside the vacuum vessel into the vacuum vessel is required differently from the above first to fifth embodiments, the vacuum vessel 601 can be readily manufactured and maintained.

However, in the meantime, there is also a disadvantage that in this embodiment, the earth electrode cannot be installed in a position opposite to the surface of a sample 608. A system in this embodiment in which the electromagnetic wave radiator is installed in a place which is not vacuum can be also applied to not only the apparatus equivalent to the fourth embodiment shown in FIG. 9 but the apparatuses equivalent to the first embodiment shown in FIG. 1, the second embodiment shown in FIG. 5 and the third embodiment shown in FIG. 7.

<Seventh Embodiment>

Figure 13A:
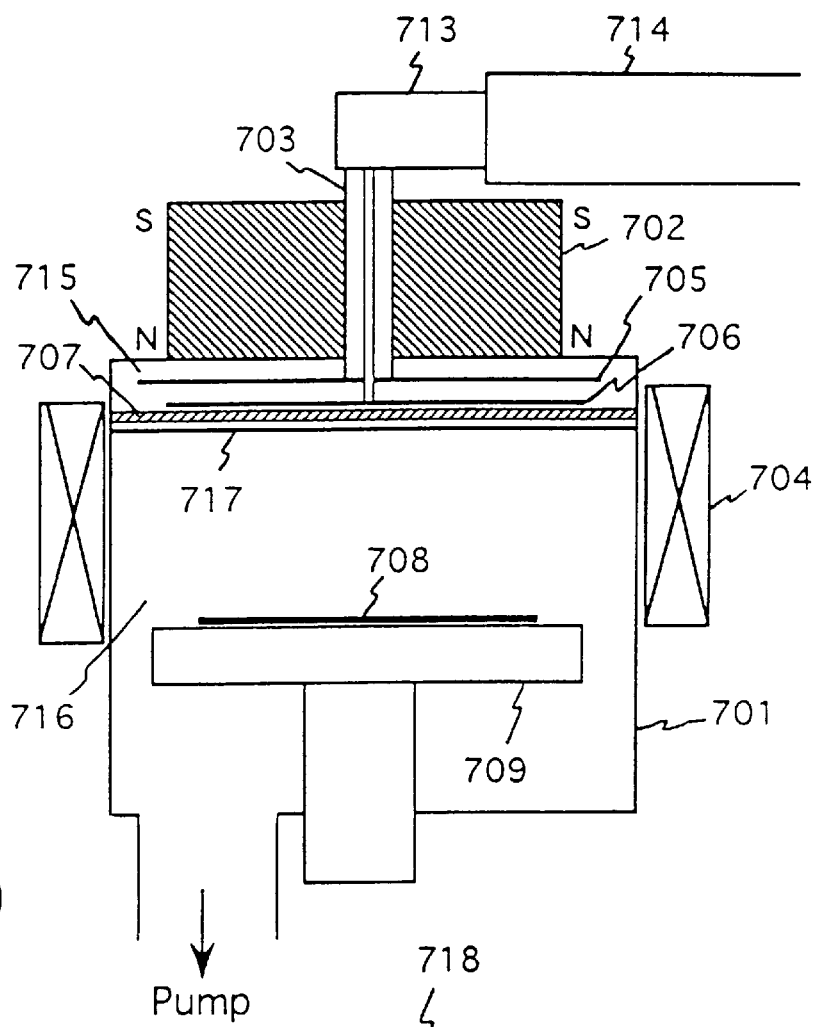
FIG. 13(a) is a schematic block diagram showing a plasma processing apparatus equivalent to a seventh embodiment according to the present invention.
Figure 13B:
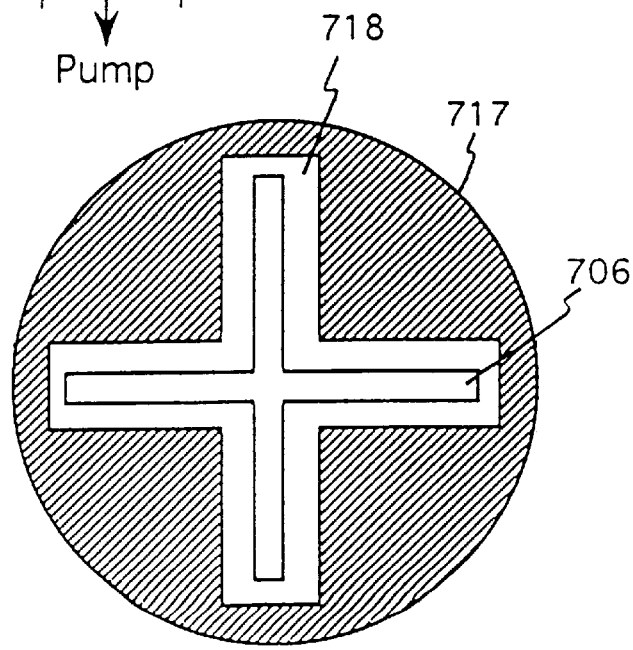
FIG. 13(b) is a bottom view of a part thereof.

FIGS. 13(a) and 13(b) show the constitution of an apparatus equivalent to a seventh embodiment. This embodiment relates to improved constitution in which the disadvantage described in the above sixth embodiment is improved. Therefore, the basic constitution of an apparatus equivalent to this embodiment is substantially the same as that in the above sixth embodiment. That is, as shown in FIG. 13(a), a permanent magnet 702 is provided on a cylindrical vacuum vessel 701 in the axial direction and a main magnetic field for generating plasma is generated in the vacuum vessel 701 by this permanent magnet 702. An electromagnet (a solenoid coil) 704 for controlling the distribution of the magnetic field generated by the permanent magnet 702 is provided on the periphery of the cylindrical vacuum vessel 701. An electromagnetic wave for generating plasma is supplied from an electromagnetic wave oscillator not shown to a radial strip-line 706 via a waveguide 714, a coaxial transducer 713 and a coaxial cable 703 and is radiated from the radial strip-line 706 into atmospheric space 715. The radial strip-line 706 is provided apart from an earth electrode in a planar shape 705 by a predetermined interval in parallel with it. An electromagnetic wave radiated into the above atmospheric space 715 passes through a partition (a quartz window) 707 and is fed into space 716 inside the vacuum vessel 701. As in the above fourth embodiment, means for applying high frequency bias to a processed sample 708 and a sample temperature control mechanism are provided to a sample stand 709, however, they are not shown in FIG. 12 for simplification.

In this embodiment, an earth electrode 717 provided with an opening 718 with the width of 300% of the width of the radial strip-line 706 along the radial strip-line 706 is installed on the side of the space 716 inside the vacuum vessel of the quartz window 707. Therefore, an electromagnetic wave radiated through the radial strip-line 706 which passes through the quartz window 707 is fed into the space 716 inside the vacuum vessel through the above opening 718. According to such constitution, the above earth electrode 717 can function as an earth electrode (an earth electrode for high frequency voltage applied the sample 708) installed in a position opposite to the surface of a processed sample 708. As in the above embodiments, the above reaction control function can be provided to this earth electrode 717 by forming it by material such as graphite and others. In this embodiment, the width of the opening 718 of the earth electrode 717 is set to 300% of the width of the radial strip-line 706, however, the similar effect can be also obtained if it is set to an arbitrary width in the range of 100 to 500%.

<Eighth Embodiment>

Figure 14A:
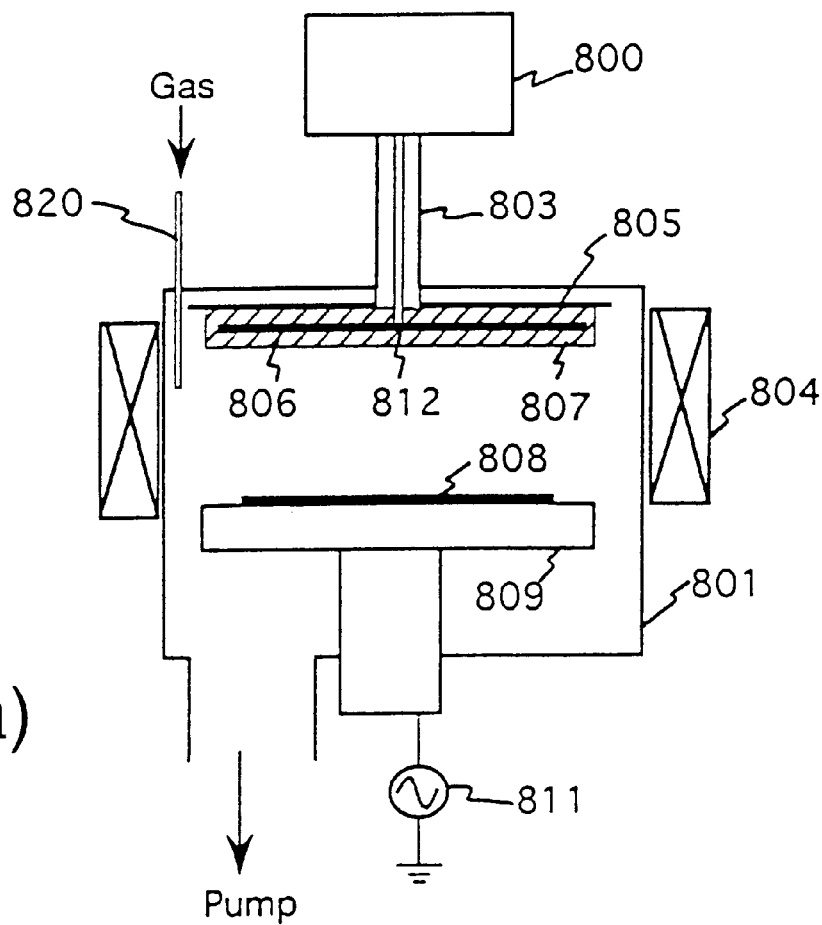
FIG. 14(a) is a schematic block diagram showing a plasma processing apparatus equivalent to an eighth embodiment according to the present invention.
Figure 14B:
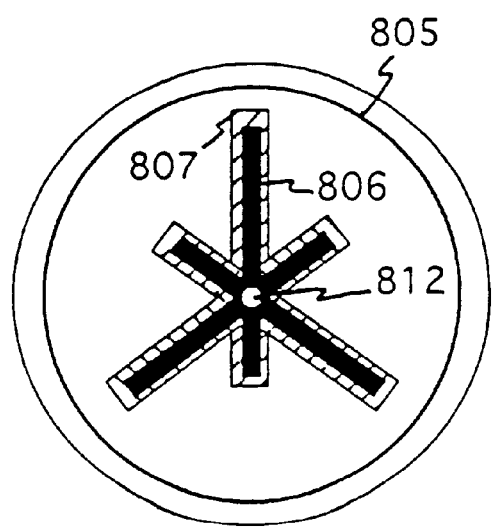
FIG. 14(b) is a bottom view thereof.

FIGS. 14(a) and 14(b) show the constitution of an apparatus equivalent to an eighth embodiment. This embodiment relates to an improved transformed example of the apparatus equivalent to the above fourth embodiment and therefore, the basic constitution of an apparatus is substantially the same as that in the fourth embodiment. A solenoid coil 804 is provided on the periphery of a cylindrical vacuum vessel 801 and a magnetic field for generating plasma is generated in space inside the vacuum vessel 801 by the solenoid coil 804. An electromagnetic wave for generating plasma is supplied from an electromagnetic wave source 800 to an electromagnetic wave radiation antenna 806 via a coaxial cable 803 and is radiated into space inside the vacuum vessel 801. A processed sample 808 is loaded onto a sample stand 809 and high frequency bias is applied to the processed sample by high frequency bias applying means 811. Source gas for generating plasma is supplied to the vacuum vessel 801 via a gas leading pipe 820.

In this embodiment, antenna structure is devised to enhance electromagnetic wave radiation efficiency from each antenna part arranged radially of an electromagnetic wave radiation antenna 806. That is, in this embodiment, the electromagnetic wave radiation antenna 806 consisting of three linear strip-line antenna parts is provided on an earth electrode 805 connected to the outside conductor of the coaxial cable 803 for supplying an electromagnetic wave. In this embodiment three antenna parts are provided, however, five or more odd antenna parts may be provided. When an intersection is provided at a point other than the center of each antenna part if a plurality of linear antenna parts are crossed, the number of antenna parts must be odd so as to radiate an electromagnetic wave uniformly. The electromagnetic wave radiation antenna 806 is coated with quartz glass 807. In this embodiment, an intersection is provided at a point off from a position which functions as the node of the current and voltage distribution of an electromagnetic wave on each antenna part, three linear antenna parts are crossed and the above intersection functions as a feed point 812 of an electromagnetic wave supplied via the coaxial cable 803. The transmission efficiency of an electromagnetic wave between the coaxial cable 803 for supplying an electromagnetic wave and each antenna part can be enhanced by setting the feed point 812 to such a position and an electromagnetic wave can be efficiently supplied.

<Ninth Embodiment>

Figure 15A:
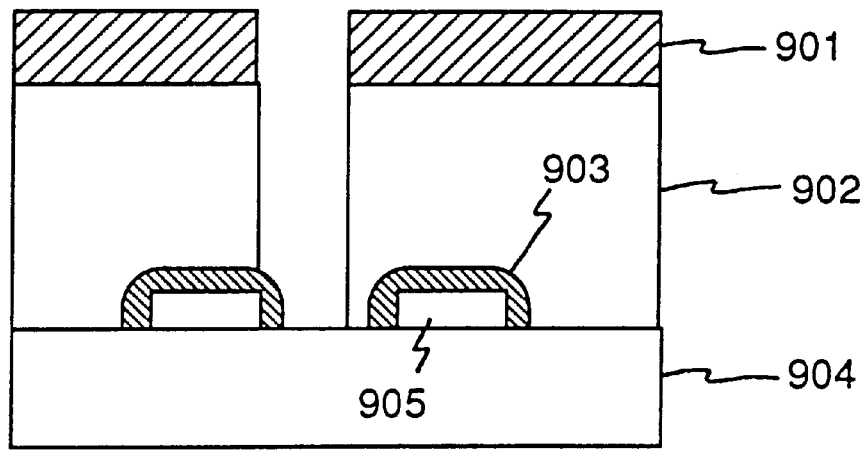
FIGS. 15(a) and 15(b) explain examples of processing in a ninth embodiment according to the present invention.
Figure 15B:
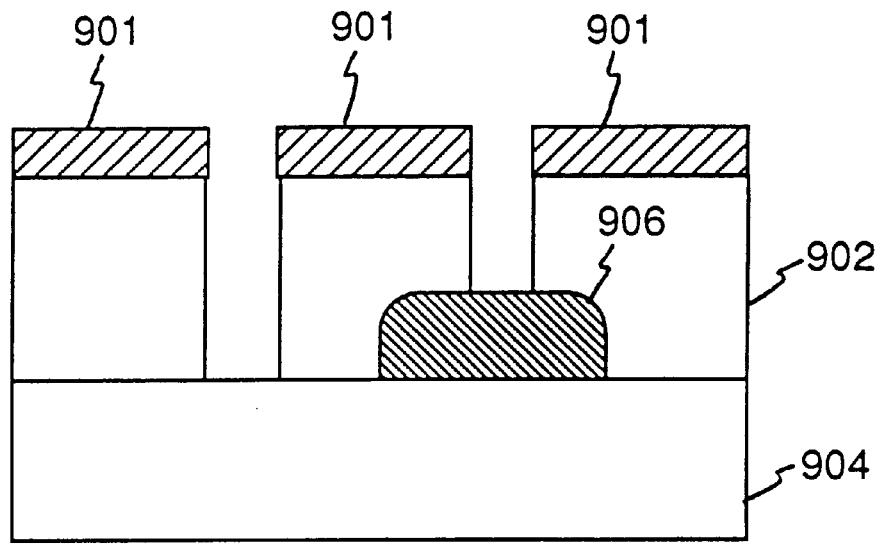

FIGS. 15(a) and 15(b) show an example in which an integrated circuit is processed by a plasma processing apparatus according to the present invention. FIG. 15(a) shows an example in which a self-aligned contact is processed by etching silicon oxide, in detail a polysilicon elect rode 905 and a silicon nitride film 903 are formed on a silicon substrate 904, a silicon oxide film 902 as an insulating film is provided on them and the silicon oxide film 902 is etched using a resist mask 901. FIG. 15(b) shows another example in which a contact is processed, in detail a memory cell 906 is formed on the silicon substrate 904, the silicon oxide film 902 as an insulating film is provided on it and this silicon oxide film 902 is processed using the resist mask 901. In the above both examples, a contact hole with the diameter of 0.3 µm or less and high aspect ratio is required to be processed at a high processing rate and with high processing selectivity. The above "high processing selectivity" means only a silicon oxide film to be processed is selectively processed at a high speed, silicon nitride or silicon is hardly processed in the case of FIG. 15(a) and silicon is hardly processed in the case of FIG. 15(b). In a conventional plasma processing apparatus, when the density of plasma is enhanced to obtain a high processing rate, the dissociation of source gas too advances and it is difficult to obtain the above high processing selectivity. In the meantime, in an apparatus according to the present invention, as electron temperature is low even if the density of plasma is high, the excessive dissociation of source gas is prevented and high processing selectivity can be obtained. Further, a high processing rate and high processing selectivity are compatible by applying high frequency voltage to an electrode arranged in a position opposite to the wall of a vacuum vessel, an electromagnetic wave radiation antenna or a processed sample and providing a radical control function utilizing reaction on the surface of the electrode to which high frequency voltage is applied.

The embodiments according to the present invention are described above, however, the present invention is not limited to the above embodiments. For example, in the above embodiments, a permanent magnet the surface magnetic flux density in the center of which is 1,000 gauss is used, however, a permanent magnet with arbitrary surface magnetic flux density in the range of 200 to 5,000 gauss may be used. The desired distribution of a magnetic field can be obtained by setting the diameter of a used permanent magnet suitably.

In the above fourth to eighth embodiments, a permanent magnet with the diameter of 30 cm and the thickness of 10 cm is used, however, the effective distribution of a magnetic field can be formed by using a magnet with the diameter equal to that of a processed sample or equivalent to 70 to 150% of the diameter of a processing sample and the thickness equivalent to 10 to 100% of the diameter of a processed sample. If particularly the diameter of a permanent magnet is large than that of a sample and further, the thickness is close to the above diameter, the ideal distribution of a magnetic field can be formed. A permanent magnet with a large diameter may be formed by arranging a plurality of small magnets closely and magnetizing them vertically equivalently in place of one permanent magnet. If a permanent magnet with a large diameter is formed by arranging a plurality of small magnets closely and magnetizing them vertically equivalently, the in-plane distribution of a magnetic field can be regulated by constituting so that an individual small magnet can be moved vertically.

In the above third to seventh embodiments, a radial strip-line consists of four parts, however, the similar effect can be also obtained if a strip-line is formed symmetrically and radially by 3 to 20 parts. In the eighth embodiment, a case that a radial strip-line consists of three parts is shown, however, if a strip-line consists of three or more odd parts, the similar function can be obtained.

In the above first to eighth embodiments, a solenoid coil or the combination of a solenoid coil and a permanent magnet is used for generating a magnetic field, however, in any embodiment, any constitution of only a solenoid coil, the combination of a solenoid coil and a permanent magnet and further, only a permanent magnet may be adopted.

In the above fifth to eighth embodiments, a strip-line is arranged radially, however, the similar effect can be also obtained if plural linear strip-lines are arranged in parallel and each strip-line is fed.

As clear from the above description, according to the present invention, power consumed by an electromagnet in an electron cyclotron resonance-type plasma generator can be greatly reduced and high density ion and radical can be supplied to the surface of a sample. An earth electrode can be installed in a position opposite to a processed sample and high frequency bias can be uniformed.

Further, high density plasma can be generated even under low gas pressure by generating plasma by electron cyclotron resonance by an electromagnetic wave in an ultra-high frequency band, in addition, the vapor phase of high density plasma in the low degree of dissociation can be realized and a radical incident to a processed sample can be controlled by reaction on the surface of an electrode in a planar shape for radiating an electromagnetic wave. Hereby, requirements such as high throughput, high etching selectivity and processing in high aspect ratio in ultra-precise processing of 0.2 μm or less can be simultaneously met and stable etching characteristics can be obtained for a long term.

It is further understood by those skilled in the art that the foregoing description is a preferred embodiment of the disclosed device and that various changes and modifications may be made in the invention without departing from the spirit and scope thereof.

What is claimed is:

1. A plasma processing apparatus, comprising:
    a vacuum vessel;
    means for evacuating space inside said vacuum vessel;
    means for leading reactive gas into said vacuum vessel;
    a sample stand provided in said vacuum vessel for loading a processed sample onto it; and
    a planar plate provided in said vacuum vessel for radiating an electromagnetic wave for generating plasma in space inside said vacuum vessel.

2. A plasma processing apparatus according to claim 1, wherein:
    said planar plate is provided in a position which is in contact with plasma generated in space inside said vacuum vessel.

3. A plasma processing apparatus according to claim 1, wherein:
    said planar plate is provided opposite to the surface of said processed sample loaded onto said sample stand.

4. A plasma processing apparatus according to claim 1, further comprising:
    means provided outside said vacuum vessel for generating a magnetic field for generating said plasma by synergism with said electromagnetic wave radiated from said planar plate into space inside said vacuum vessel.

5. A plasma processing apparatus according to claim 1, wherein:
    first high frequency voltage in the range of 300 MHz to 1 GHz is applied to said planar plate.

6. A plasma processing apparatus according to claim 5, wherein:
    second high frequency voltage in addition to said first high frequency voltage is applied to said planar plate.

7. A plasma processing apparatus according to claim 6, wherein:
    the frequency of said second high frequency voltage is set to the half or less of the frequency of said first high frequency voltage.

8. A plasma processing apparatus according to claim 1, wherein:
    a substance which can transmit said electromagnetic wave is provided in the vicinity of the surface which is in contact with said plasma of said planar plate.

9. A plasma processing apparatus according to claim 8, wherein:
    said substance which can transmit said electromagnetic wave consists of any of alumina, quartz, silicon nitride, boron nitride, steatite and zirconia.

10. A plasma processing apparatus according to claim 1, further comprising:
    means for varying distance between said processed sample loaded onto said sample stand and said planar plate.

11. A plasma processing apparatus according to claim 1, wherein:
    an electromagnetic wave radiated from said planar plate into space inside said vacuum vessel is a circularly polarized wave.

12. A plasma processing apparatus, comprising:
    a vacuum vessel;
    means for adjusting pressure in said vacuum vessel to predetermined pressure in the range of 0.1 Pa to 3 Pa;
    a sample stand provided in said vacuum vessel for loading a processed sample on it;
    means for applying first high frequency voltage to said sample stand;
    a planar plate arranged opposite to the surface of said processed sample loaded onto said sample stand in said vacuum vessel for radiating an electromagnetic wave for generating plasma; and
    means for generating a magnetic field for generating plasma in said vacuum vessel by synergism with an electromagnetic wave radiated from said planar plate in to said vacuum vessel for generating said plasma.

13. A plasma processing apparatus, comprising:
    a vacuum vessel;
    means for evacuating space inside said vacuum vessel;
    means for leading reactive gas into said vacuum vessel;
    a sample stand provided in said vacuum vessel for loading a processed sample on it;
    means for applying high frequency voltage to said sample stand;
    a planar plate arranged opposite to the upper face of said sample stand in said vacuum vessel for radiating an electromagnetic wave for generating plasma; and
    means for supplying an electromagnetic wave for generating said plasma to said planar plate;
    means for generating a magnetic field for generating plasma in said vacuum vessel by synergism with an electromagnetic wave radiated from said planar plate into said vacuum vessel for generating said plasma.

14. A plasma processing apparatus according to claim 13, wherein:
    said planar plate is a circular conductive plate.

15. A plasma processing apparatus according to claim 13, wherein:
    said planar plate consists of graphite or silicon.

16. A plasma processing apparatus according to claim 13, wherein:
    a position in which an electromagnetic wave is supplied to said planar plate by said electromagnetic wave supply means is set to a position off from the center of said planar plate.

17. A plasma processing apparatus according to claim 13, wherein:
    said reactive gas is etching gas consisting of a compound including fluorine.

18. A plasma processing apparatus according to claim 13, wherein:

said processed sample is a semiconductor wafer.

19. A plasma processing apparatus according to claim 13, wherein:
said electromagnetic wave supply means supplies an electromagnetic wave in an ultra-high frequency band from an electromagnetic wave source to said planar plate via a high-pass filter.

20. A plasma processing apparatus according to claim 13, wherein:
said electromagnetic wave supply means supplies an electromagnetic wave in an ultra-high frequency band from an electromagnetic wave source in an ultra-high frequency band to said planar plate via a high-pass filter; and
said electromagnetic wave supply means supplies high frequency voltage with the frequency of the half or less of the frequency of said electromagnetic wave in an ultra-high frequency band from a high frequency power source different from said electromagnetic wave source in an ultra-high frequency band to said planar plate via a low-pass filter.

21. A plasma processing apparatus comprising:
a vacuum chamber provided with an intake of gas and an exhaust port of gas;
a sample stand for holding a processed sample in said vacuum chamber;
magnetic field generation means for generating a magnetic field for generating plasma in a direction perpendicular to a surface of said processed sample;
an electromagnetic wave radiation antenna consisting of a plurality of strip-lines provided on an earth electrode arranged opposite to the surface of said processed sample via an insulator; and
electromagnetic wave supply means for supplying said electromagnetic wave to said electromagnetic wave radiation antenna, wherein
gas fed into said vacuum chamber is charged by synergism between said electromagnetic wave radiated from said electromagnetic wave radiation antenna into said vacuum chamber and said magnetic field for generating plasma, wherein
said electromagnetic wave radiation antenna is arranged in space partitioned from space inside said vacuum chamber via a quartz window, wherein:
an earth electrode provided with an opening with the width of 100 to 500% of the width of each strip-line is installed along plural strip-lines constituting said electromagnetic wave radiation antenna on the side of space inside said vacuum chamber of said quartz window.

22. A plasma processing apparatus comprising:
a vacuum chamber provided with an intake of gas and an exhaust port of gas;
a sample stand for holding a processed sample in said vacuum chamber;
magnetic field generation means for generating a magnetic field for generating plasma in a direction perpendicular to a surface of said processed sample;
an electromagnetic wave radiation antenna consisting of a plurality of strip-lines provided on an earth electrode arranged opposite to the surface of said processed sample via an insulator; and
electromagnetic wave supply means for supplying said electromagnetic wave to said electromagnetic wave radiation antenna, wherein
gas fed into said vacuum chamber is charged by synergism between said electromagnetic wave radiated from said electromagnetic wave radiation antenna into said vacuum chamber and said magnetic field for generating plasma, wherein:
high frequency voltage supply means for applying high frequency voltage to said processed sample and temperature control means for holding said processed sample under fixed temperature are provided to said sample stand.

23. A plasma processing apparatus comprising:
a vacuum chamber provided with an intake of gas and an exhaust port of gas;
a sample stand for holding a processed sample in said vacuum chamber;
magnetic field generation means for generating a magnetic field for generating plasma in a direction perpendicular to a surface of said processed sample;
an electromagnetic wave radiation antenna consisting of a plurality of strip-lines provided on an earth electrode arranged opposite to the surface of said processed sample via an insulator; and
electromagnetic wave supply means for supplying said electromagnetic wave to said electromagnetic wave radiation antenna, wherein
gas fed into said vacuum chamber is charged by synergism between said electromagnetic wave radiated from said electromagnetic wave radiation antenna into said vacuum chamber and said magnetic field for generating plasma, wherein:
the frequency of an electromagnetic wave supplied to said electromagnetic wave radiation antenna by said electromagnetic wave supply means is set in the range of 400 MHz to 2.5 GHz.

* * * * *